US009007758B2

(12) United States Patent
Wilson et al.

(10) Patent No.: US 9,007,758 B2
(45) Date of Patent: Apr. 14, 2015

(54) PORTABLE ELECTRONIC DEVICE CASE

(71) Applicant: Wimo Labs LLC, Chicago, IL (US)

(72) Inventors: Scott H. Wilson, Chicago, IL (US);
Dennis M. Puhalla, Chicago, IL (US);
Kevin G. Brennan, Chicago, IL (US)

(73) Assignee: Wimo Labs LLC, Chicago, IL (US)

( * ) Notice: Subject to any disclaimer, the term of this patent is extended or adjusted under 35 U.S.C. 154(b) by 128 days.

(21) Appl. No.: 13/875,878

(22) Filed: May 2, 2013

(65) Prior Publication Data

US 2013/0273944 A1  Oct. 17, 2013

Related U.S. Application Data

(63) Continuation-in-part of application No. 13/494,170, filed on Jun. 12, 2012, now Pat. No. 8,787,009, and a continuation-in-part of application No. 29/418,314, filed on Apr. 13, 2012, now Pat. No. Des. 683,338.

(51) Int. Cl.
*G06F 1/16* (2006.01)
*H04M 1/02* (2006.01)
(Continued)

(52) U.S. Cl.
CPC ............... *H04M 1/026* (2013.01); *H04M 1/04* (2013.01); *H04M 1/72575* (2013.01); *H04M 1/18* (2013.01); *Y10S 248/918* (2013.01)

(58) Field of Classification Search
USPC .............. 455/41.2, 575.3, 566, 575.1, 575.4, 455/90.3, 418, 567; 206/320, 301, 509, 206/386, 581, 600, 278, 299, 766; 381/334, 381/371, 386, 333, 380, 120, 384, 387, 381/311; 345/80, 1.3, 173, 174, 168, 661, 345/418, 419, 204, 619, 30, 311; 361/679.21, 679.01, 679.27, 679.16, 361/679.26, 679.3, 679.28, 679.04, 679.55, 361/679.29, 679.57, 679.02, 679.03, 361/679.23, 679.09; 248/918, 346.01, 248/176.1, 459, 340, 461, 174; 349/58, 73, 349/62

See application file for complete search history.

(56) References Cited

U.S. PATENT DOCUMENTS

| | | | |
|---|---|---|---|
| 6,068,119 A | 5/2000 | Derr et al. | |
| 6,094,785 A | 8/2000 | Montgomery et al. | |

(Continued)

FOREIGN PATENT DOCUMENTS

| | | |
|---|---|---|
| EP | 0527712 A1 | 2/1993 |
| KR | 200421862 | 7/2006 |

OTHER PUBLICATIONS

International Search Report of International Patent Application Publication No. WO2013/188342, dated Sep. 24, 2013, pp. 1-2.

*Primary Examiner* — Hung Duong
(74) *Attorney, Agent, or Firm* — Neal, Gerber & Eisenberg LLP

(57) ABSTRACT

A protective case for housing a wireless communication device is provided. The protective case may include integral wireless communication circuitry independent of the wireless communication device. The wireless communication circuitry may be configured to enable communication between the protective case and one or more remote communication devices via a short range network. The protective case may further include an integral speaker configured to reproduce audio signals received by the integral wireless communication circuitry and an integral power source configured to provide power to at least the integral wireless communication circuitry and the integral speaker. The integral wireless communication circuitry and the integral speaker may be capable of functioning independently of the wireless communication device.

12 Claims, 15 Drawing Sheets

(51) Int. Cl.
  *H04M 1/04* (2006.01)
  *H04M 1/725* (2006.01)
  *H04M 1/18* (2006.01)

(56) References Cited

U.S. PATENT DOCUMENTS

| | | | |
|---|---|---|---|
| 6,179,122 B1 * | 1/2001 | Moncrief et al. | ............. 206/320 |
| 6,317,313 B1 | 11/2001 | Mosgrove et al. | |
| 6,415,138 B2 | 7/2002 | Sirola et al. | |
| 6,525,928 B1 | 2/2003 | Madsen et al. | |
| 6,536,589 B2 | 3/2003 | Chang | |
| 6,646,864 B2 | 11/2003 | Richardson | |
| 6,659,274 B2 | 12/2003 | Enners | |
| 6,995,976 B2 | 2/2006 | Richardson | |
| 7,158,376 B2 | 1/2007 | Richardson et al. | |
| 7,180,735 B2 | 2/2007 | Thomas et al. | |
| 7,230,823 B2 | 6/2007 | Richardson et al. | |
| 7,312,984 B2 | 12/2007 | Richardson et al. | |
| 7,449,650 B2 | 11/2008 | Richardson et al. | |
| D600,908 S | 9/2009 | Richardson et al. | |
| 7,609,512 B2 | 10/2009 | Richardson et al. | |
| 7,612,997 B1 | 11/2009 | Diebel et al. | |
| 7,663,879 B2 | 2/2010 | Richardson et al. | |
| 7,688,580 B2 | 3/2010 | Richardson et al. | |
| D615,536 S | 5/2010 | Richardson et al. | |
| D616,360 S | 5/2010 | Huang | |
| D616,361 S | 5/2010 | Huang | |
| D617,784 S | 6/2010 | Richardson et al. | |
| D617,785 S | 6/2010 | Richardson et al. | |
| 7,782,610 B2 | 8/2010 | Diebel et al. | |
| 7,889,489 B2 | 2/2011 | Richardson et al. | |
| 7,889,498 B2 | 2/2011 | Diebel et al. | |
| D634,741 S | 3/2011 | Richardson et al. | |
| 7,907,394 B2 | 3/2011 | Richardson et al. | |
| D636,386 S | 4/2011 | Richardson et al. | |
| 7,933,122 B2 | 4/2011 | Richardson et al. | |
| D653,202 S | 1/2012 | Hasbrook et al. | |
| D659,094 S | 5/2012 | Brand et al. | |
| 8,204,561 B2 | 6/2012 | Mongan et al. | |
| D669,458 S | 10/2012 | Wilson et al. | |
| 8,286,789 B2 | 10/2012 | Wilson et al. | |
| 8,312,991 B2 | 11/2012 | Diebel et al. | |
| 8,328,008 B2 | 12/2012 | Diebel et al. | |
| D675,161 S | 1/2013 | Rayner | |
| 8,342,325 B2 | 1/2013 | Rayner | |
| 8,367,235 B2 | 2/2013 | Huang | |
| 8,393,466 B2 | 3/2013 | Rayner | |
| 8,395,894 B2 | 3/2013 | Richardson et al. | |
| 8,442,604 B1 | 5/2013 | Diebel | |
| 8,457,701 B2 | 6/2013 | Diebel | |
| D685,327 S | 7/2013 | Rayner | |
| 8,483,758 B2 | 7/2013 | Huang | |
| 8,509,864 B1 | 8/2013 | Diebel | |
| 8,526,180 B2 | 9/2013 | Rayner | |
| 8,531,834 B2 | 9/2013 | Rayner | |
| 8,548,541 B2 | 10/2013 | Rayner | |
| 8,564,950 B2 | 10/2013 | Rayner | |
| 8,567,599 B2 | 10/2013 | Beatty et al. | |
| 8,570,737 B2 | 10/2013 | Rayner | |
| 2005/0176369 A1 * | 8/2005 | Holmes et al. | ............... 455/41.2 |
| 2011/0159324 A1 | 6/2011 | Huang et al. | |
| 2011/0287726 A1 | 11/2011 | Huang | |
| 2011/0297578 A1 | 12/2011 | Stiehl | |
| 2012/0043236 A1 | 2/2012 | Szucs et al. | |
| 2013/0043777 A1 | 2/2013 | Rayner | |
| 2013/0070948 A1 * | 3/2013 | Lee et al. | ....................... 381/334 |
| 2013/0092576 A1 | 4/2013 | Rayner | |
| 2013/0181584 A1 | 7/2013 | Whitten et al. | |

* cited by examiner

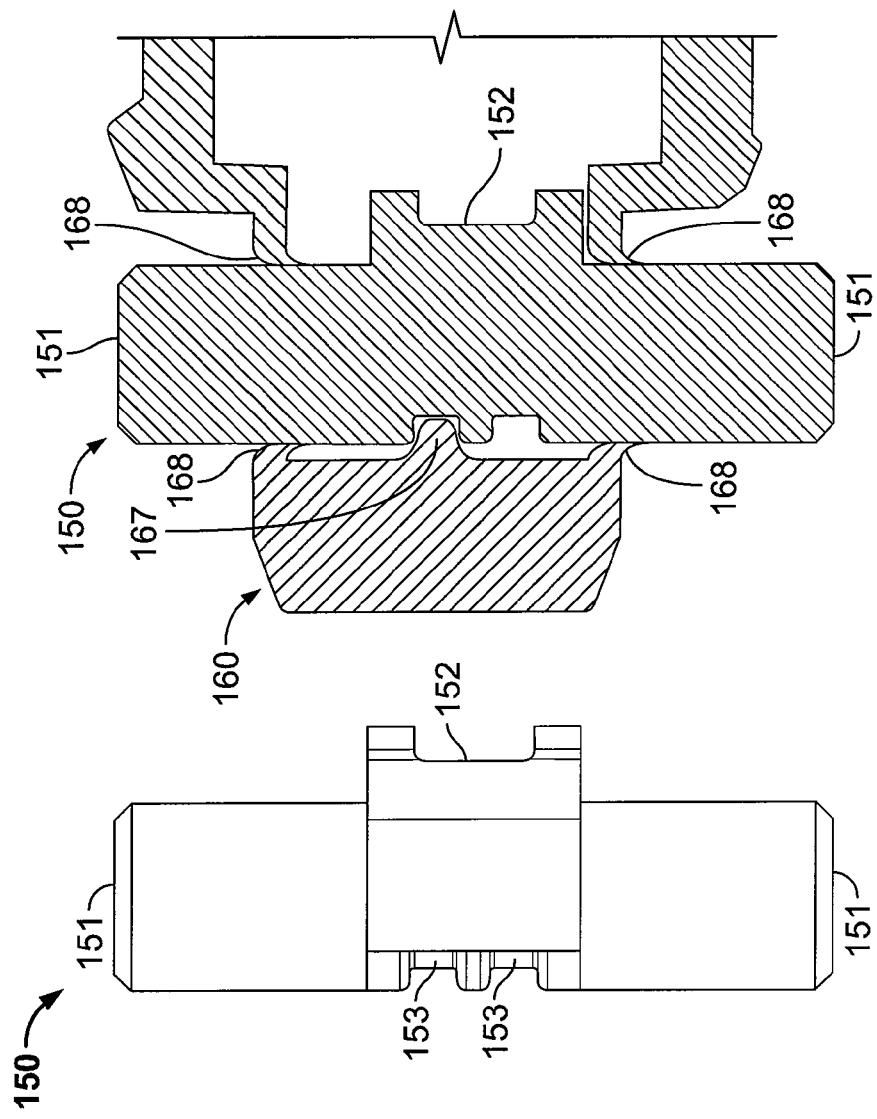
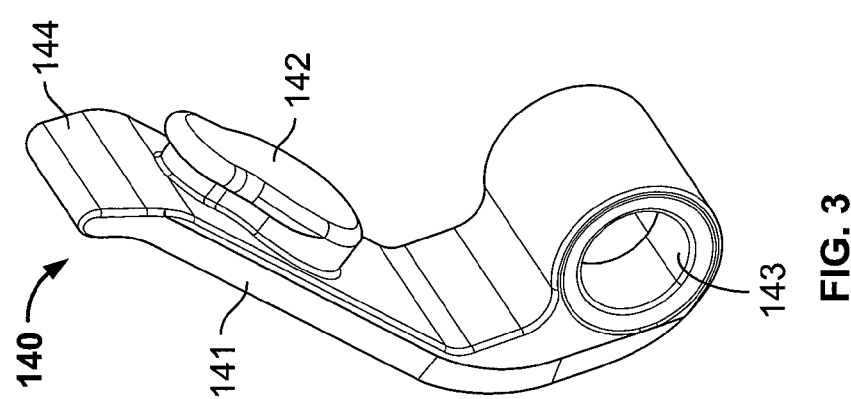
FIG. 4B
FIG. 4A
FIG. 3

PORTABLE ELECTRONIC DEVICE CASE

CROSS REFERENCE TO RELATED APPLICATIONS

This application is a continuation-in-part application of U.S. patent application Ser. No. 13/494,170, filed on Jun. 12, 2012, and U.S. patent application Ser. No. 29/418,314, filed on Apr. 13, 2012, each of which is herein incorporated by reference in its entirety.

BACKGROUND

Generally, this application relates to cases for portable electronic devices, and more particularly, to cases that may be used to protect a portable electronic device (or, more simply, a "device"). As used herein, the term "portable electronic device" may include any type of wireless communication devices, such as, e.g., mobile telephone, tablet, portable computer, gaming device, media player, smartphone, personal organizer, and the like.

A case may be designed to attempt to protect a device from collisions or impacts. A case may be designed to attempt to protect a device from contaminants or contamination. Such contaminants or contamination may include liquids, particulates, heat, cold, moisture, humidity, dirt, dust, and/or any other externally generated influence that may compromise the functionality of the device. A case may also be designed to protect interactive parts of the device (for example, touch screen) from scratching.

Most conventional portable electronic device cases are useful only to the extent that they are protecting a functioning device. That is, if the device inside the case is no longer operable, the case serves very little utility, other than to protect an inoperable device. For example, if the device is depleted of battery power, the device has little to no utility until power is restored. Similarly, if the device is unable to connect to a cellular telephone system, the utility of the device may be largely diminished.

BRIEF DESCRIPTION OF THE DRAWINGS

FIG. 3 illustrates an audio port cover of a portable electronic device case, according to techniques of the present application.

FIGS. 4A and 4B illustrate a vibration switch actuator and a portion of a boot of a portable electronic device case, according to techniques of the present application.

Figure 1A:
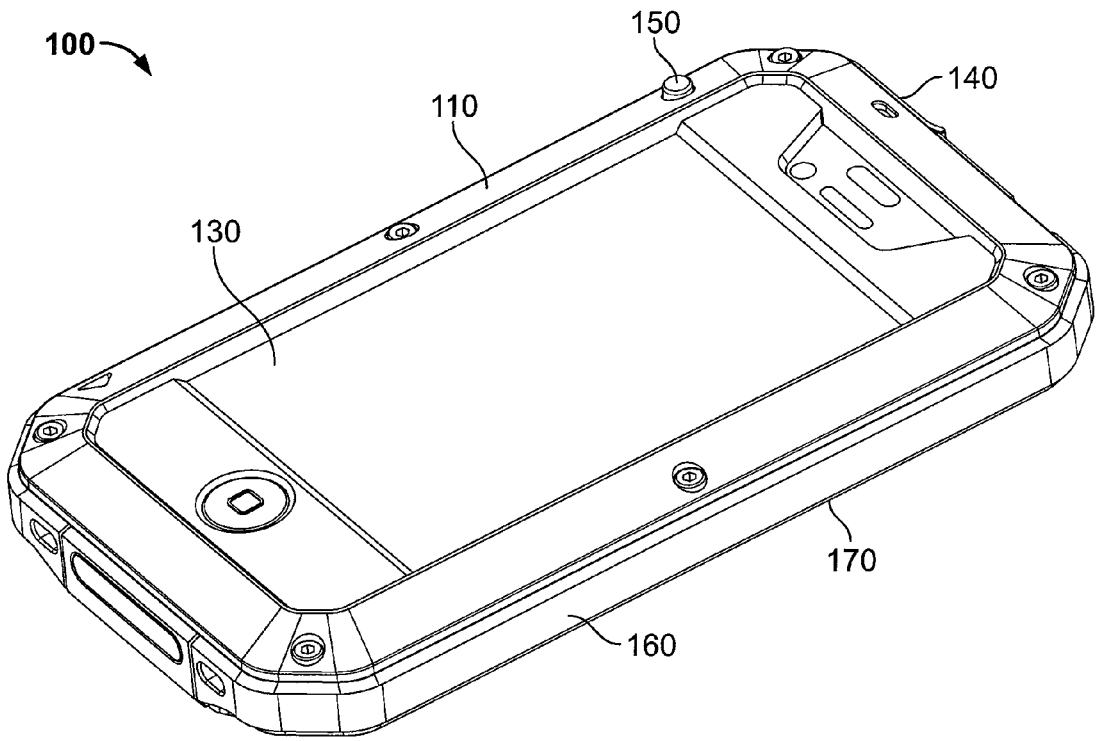
FIGS. 1A-1G illustrate different views of a portable electronic device case, according to techniques of the present application.

The foregoing summary, as well as the following detailed description of certain techniques of the present application, will be better understood when read in conjunction with the appended drawings. For the purposes of illustration, certain techniques are shown in the drawings. It should be understood, however, that the claims are not limited to the arrangements and instrumentality shown in the attached drawings. Furthermore, the appearance shown in the drawings is one of many ornamental appearances that can be employed to achieve the stated functions of the system.

DETAILED DESCRIPTION

Systems and methods for enhancing a functionality of a protective case for housing a wireless communication device, or other portable electronic device, are provided herein. More specifically, the protective case may be capable of providing enhanced functionality when, for example, one or more functions of the wireless communication device housed within the case are impaired and/or when a user of the case requires functionality that is not available from the wireless communication device. For example, the protective case may be configured to implement one or more of an audio function, a communication function, a light function, or a power function independently of the wireless communication device housed therein.

According to one aspect, the communication and audio functions of the protective case may be designed for situations where cellular communication is unavailable (e.g., the user is "off-the-grid"), for example, due to disabled or destroyed cellular towers (e.g., in a war zone, after a natural disaster such as a hurricane or tornado, etc.), jammed cellular phone service (e.g., in highly, densely populated areas such as a marathon, a state fair, etc.), loss of power to cellular towers (e.g., during a power blackout), or a general absence of cellular service in the user's current location (e.g., in remote areas, on top of a high mountain, out at sea, under an avalanche, etc.). In one aspect, the power function of the protective case may be designed for situations in which a battery of the wireless communication device has lost power and the user is unable to access a power outlet and/or a charging cord for recharging the battery. According to an aspect, the light function of the protective case may be designed for situations in which the user is without light (e.g., emergency situations, power failures, etc.).

According to some embodiments, a protective case for housing a wireless communication device can provide improved protection from collisions/impacts, contamination, and/or scratching. Additionally or alternatively, the protective case can provide functionality that may be independent of the wireless communications device. For example, according to one aspect, the protective case includes integral wireless communication circuitry configured to enable communication between the protective case and one or more remote communication devices via a short range network, an integral speaker configured to reproduce audio signals received by the integral wireless communication circuitry, and an integral power source configured to provide power to at least the integral wireless communication circuitry and the integral speaker. Each of the integral wireless communication circuitry, the integral power source, and the integral speaker are separate from the components of the wireless communication device and are capable of functioning independently of the wireless communication device.

According to one aspect, the integral power source of the case can be electrically connected to a primary power source of the wireless communication device. Further, the integral power source may be configured to provide power to the wireless communication device when a remaining charge in the primary power source of the wireless communication device falls below a pre-determined level.

The case may further include other integral components that can operate independently of the wireless communication device. For example, the case may include an integral antenna tuned to transmit and/or receive signals within one or more pre-determined frequency bands that are associated with the short range network. The case may further include a communication switch that controls communication with the one or more remote communication devices. For example, in one embodiment, actuation of the communication switch may place the wireless communication circuitry in a transmission mode, wherein the wireless communication circuitry transmits signals to the one or more remote communication devices. In one embodiment, non-actuation of the communication switch may place the wireless communication circuitry in a reception mode, wherein the wireless communication circuitry receives signals from the one or more remote communication devices.

As another example, the case may include an integral printed circuit board that is electronically coupled to the integral wireless communication circuitry, the integral speaker, and/or the integral power source, and may also be coupled to other components within the case, such as the integral antenna and/or the communication switch. As yet another example, the case may include an integral light source that is powered by the power source of the case. The integral light source may be, for example, a high power LED.

In accordance with one embodiment, a case for holding a portable electronic device includes an anterior portion, a posterior portion, a boot, a transparent covering portion, and a plurality of fasteners. The anterior portion may have a front surface, a back surface, and a screen window. The posterior portion may have a front surface and a back surface. The boot may be flexible and may fit around the portable electronic device. The boot may have a sidewall, a flange extending inwardly from the sidewall, and a rear panel. The sidewall may be between the anterior portion and the posterior portion. The transparent covering portion may have an outer edge, a front surface, and a back surface. The outer edge may be between the boot and the back surface of the anterior portion. The plurality of fasteners may fasten the anterior portion and the posterior portion.

The case may include an audio port cover including an aperture, an arm extending from the aperture, and a plug on a bottom surface of the arm. The audio port cover may be secured to the case by a connection through the aperture. The arm may rotate about the aperture of the audio port cover and along a primary plane of the boot. The plug may engage in an audio port aperture in the sidewall of the boot.

The case may include an audio port hollow region within the sidewall of the boot. The audio port hollow region may be located to allow access to an audio port of the portable electronic device. The case may also include an audio port aperture through the sidewall of the boot. The audio port aperture may be located to allow access into the audio port hollow region and to the audio port of the portable electronic device. The case may also include an acoustic piping aperture through the sidewall of the boot. The acoustic piping aperture may be located to allow sound to enter the audio port hollow region even when the audio port aperture is plugged. The case may have a bumper within the sidewall of the boot. The bumper may have hollow regions separated by partitions. The partitions may comprise a truss.

The case may include vibration switch actuator, which may have a post and a cup. The cup may be located on a lateral surface of the post. The post may slidably extend through vibration switch actuator apertures in the sidewall of the boot. The cup may be arranged to interface with a vibration switch on the portable electronic device and switch the vibration switch ON and OFF as the post slides in and out. The vibration switch actuator may include an ON detent and an OFF detent. The boot may include a stop nub located to engage with the ON detent and the OFF detent. The stop nub may be arranged to alternately snap into the ON detent or the OFF detent. This may stop a movement the vibration switch actuator and provide a physical pulse to indicate a change in position of the vibration switch actuator.

The boot may include wiper seals proximate the vibration switch actuator apertures in the boot. The wiper seals may be located to form seals with the vibration switch actuator. The posterior portion may include a rear window. The boot may also include a rear window and a rear window seal surrounding the rear window. The rear window seal of the boot may compress against the back side of the device.

The sidewall of the boot may include at least one actuator (for example, volume up actuator, a volume down actuator, or a power actuator) arranged to receive an actuation force on an outer area of the sidewall and to translate the actuation force towards a switch on the portable electronic device. The anterior portion may include a lip configured to compress an outer region of the transparent covering portion against the portable electronic device.

The case may include a communications interface door assembly including a communications interface door plug, wherein the communications interface door plug is configured to engage in a communications interface aperture in the boot sidewall of the boot. The communications interface door assembly may include a flexible hinged portion attached to the posterior portion and including a plug mating portion that receives the communications interface door plug. The communications interface door plug may be rigid.

In accordance with an embodiment, a boot for use in a case for a portable electronic device may include a rear panel and a sidewall extending from the rear panel. The side wall may include fastener apertures configured to receive a corresponding plurality of fasteners, an audio port hollow region located to allow access to an audio port of the portable electronic device, an audio port aperture located to allow access to the audio port hollow region, an acoustic piping aperture located to allow sound to enter the audio port hollow region even when the audio port aperture is plugged, a microphone aperture located to allow sound to pass through the sidewall to reach a microphone of the portable electronic device, a speaker aperture located to allow sound emanating from a speaker of the portable electronic device to pass through the sidewall, a communications interface aperture located to allow access to a communications port of the portable electronic device, and at least one actuator. The boot may also The boot may also include an anterior portion groove configured to receive a ridge of an anterior portion, and a posterior portion groove configured to receive a ridge of a posterior portion.

The sidewall may include hollow regions separated by partitions. The partitions may comprise a truss. The sidewall may also include an audio port cover recess configured to accept a portion of an audio port cover. The sidewall further may also include vibration switch actuator apertures located to receive a vibration switch actuator. The sidewall may also include a stop nub located to engage with an ON detent and an OFF detent of the vibration switch actuator. The sidewall may also include a plurality of wiper seals proximate the plurality of vibration switch actuator apertures, wherein the plurality of wiper seals are configured to form a seal with the vibration switch actuator.

The rear panel may also include a rear window and a rear window seal on the front surface of the rear panel around the rear window.

For purposes of continuity, this application generally refers to a case 100 or 200. However, specific attributes of the case 100 or 200 may stand alone or may be part of a case having different attributes from case 100 or 200 or a case having only some of the attributes of case 100 or 200.

Figure 1B:
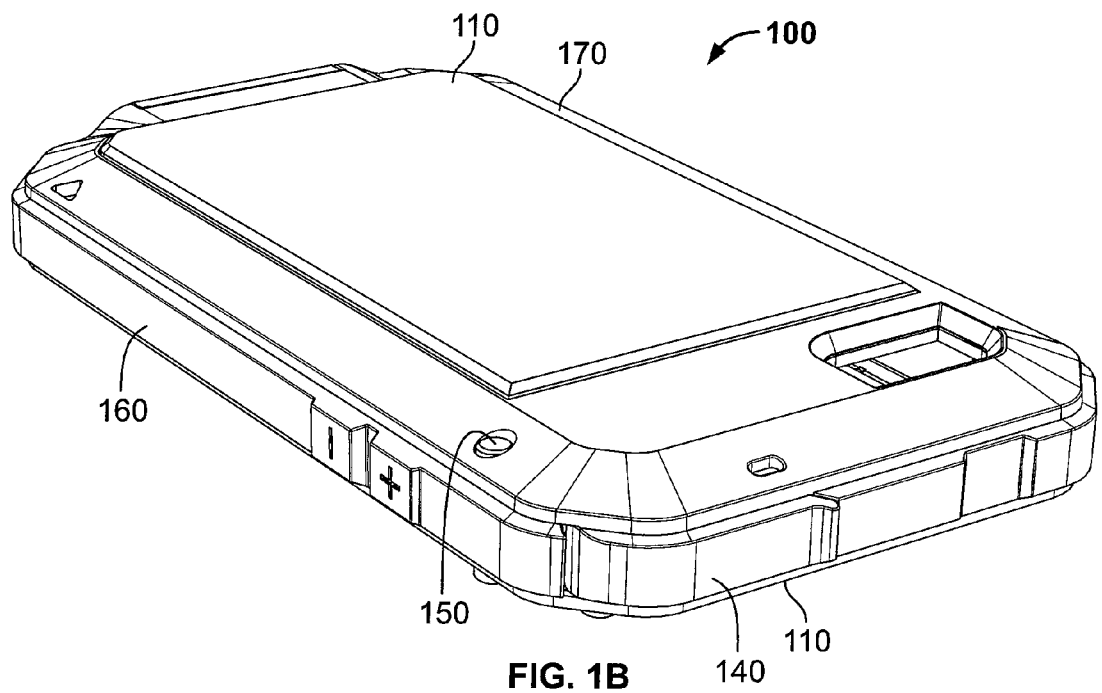
Figure 1D:
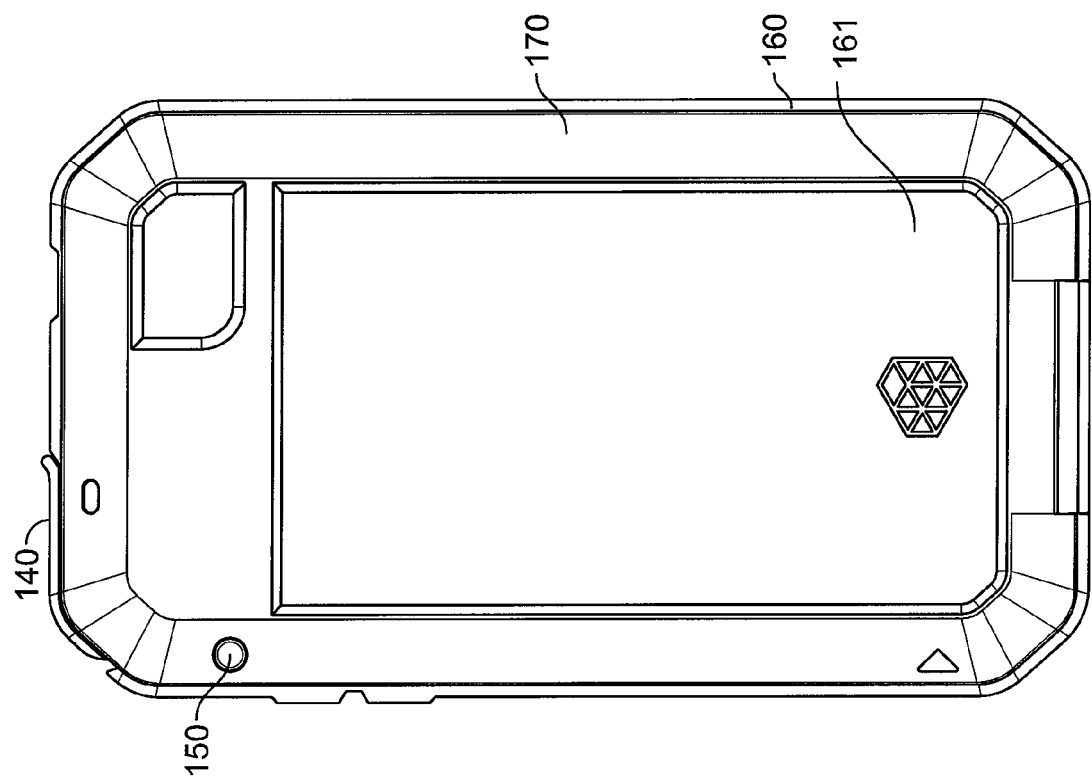
Figure 1C:
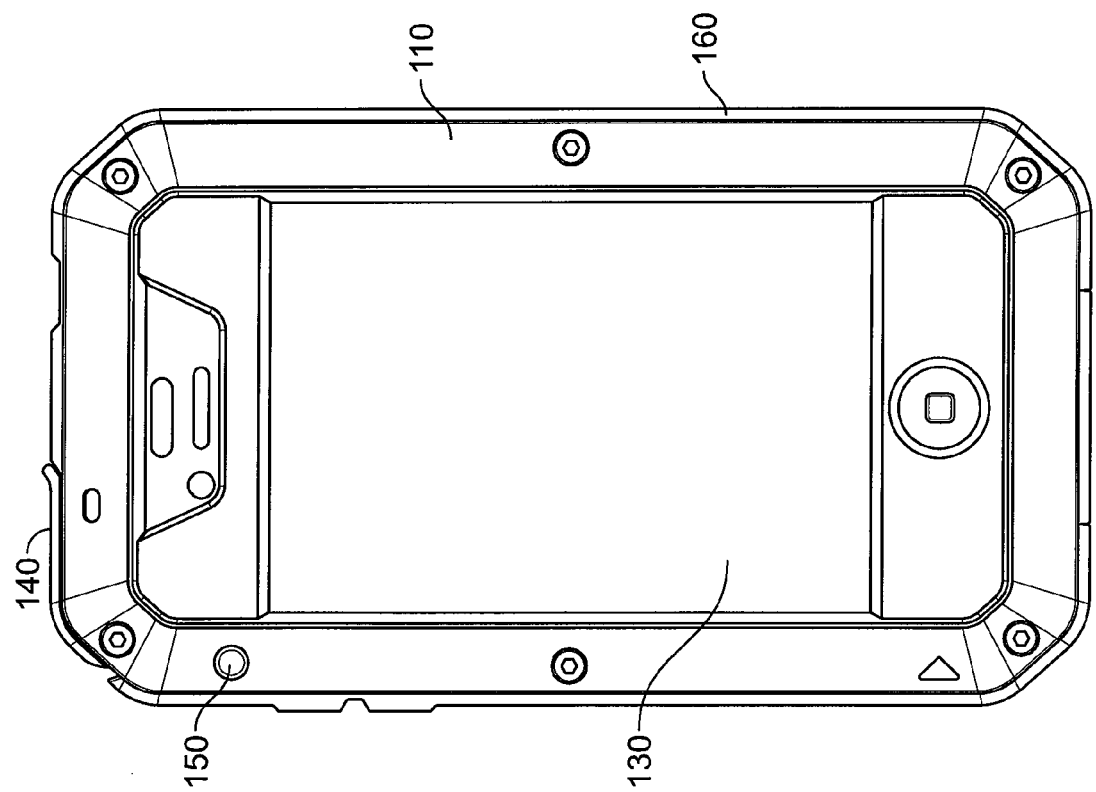
Figure 1E:
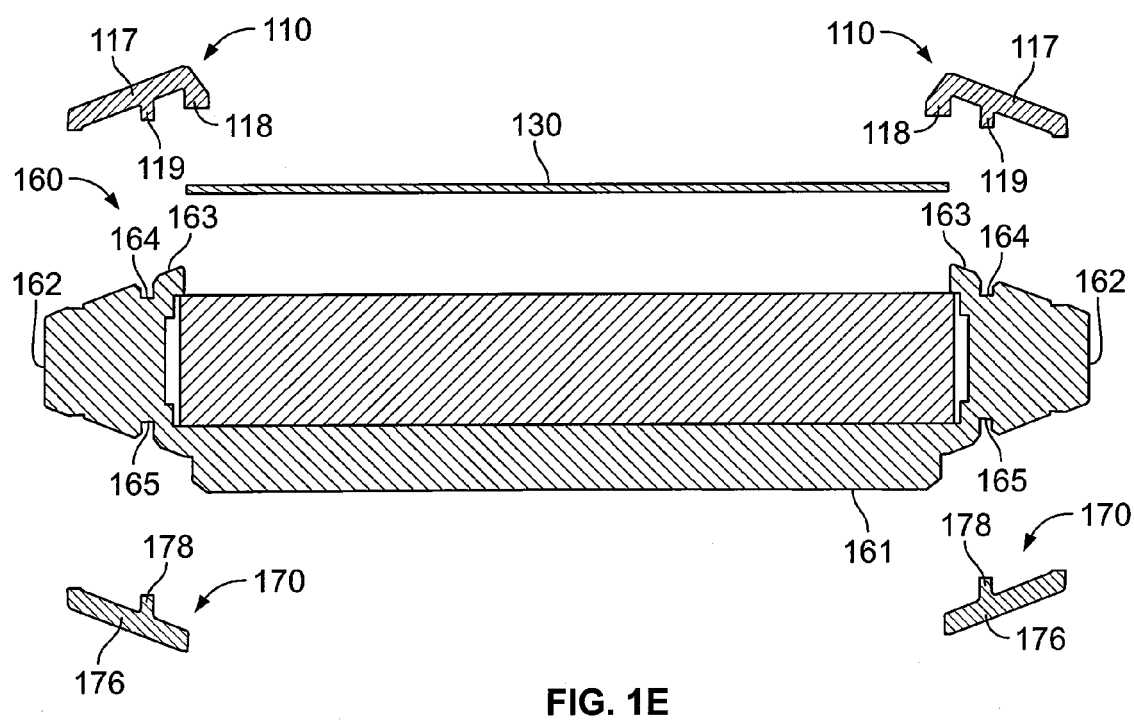
Figure 1F:
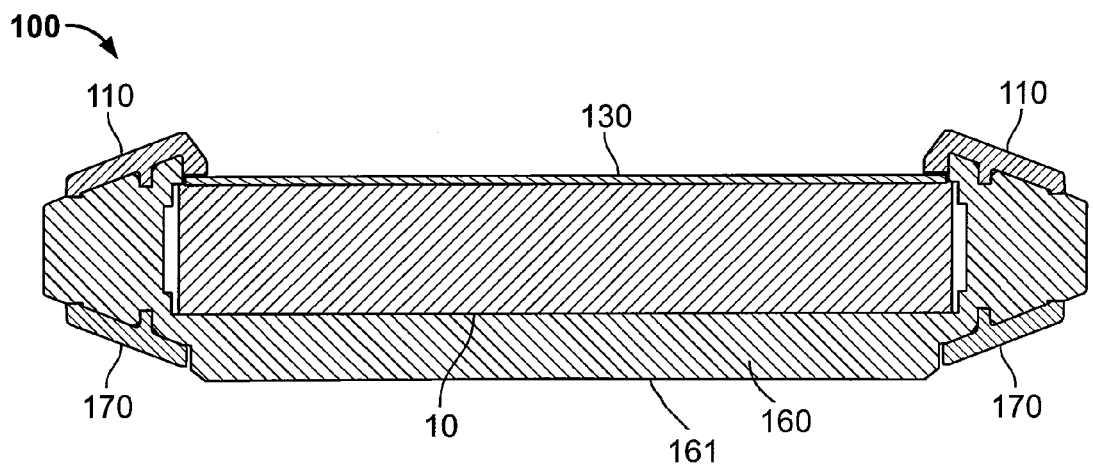
Figure 1G:
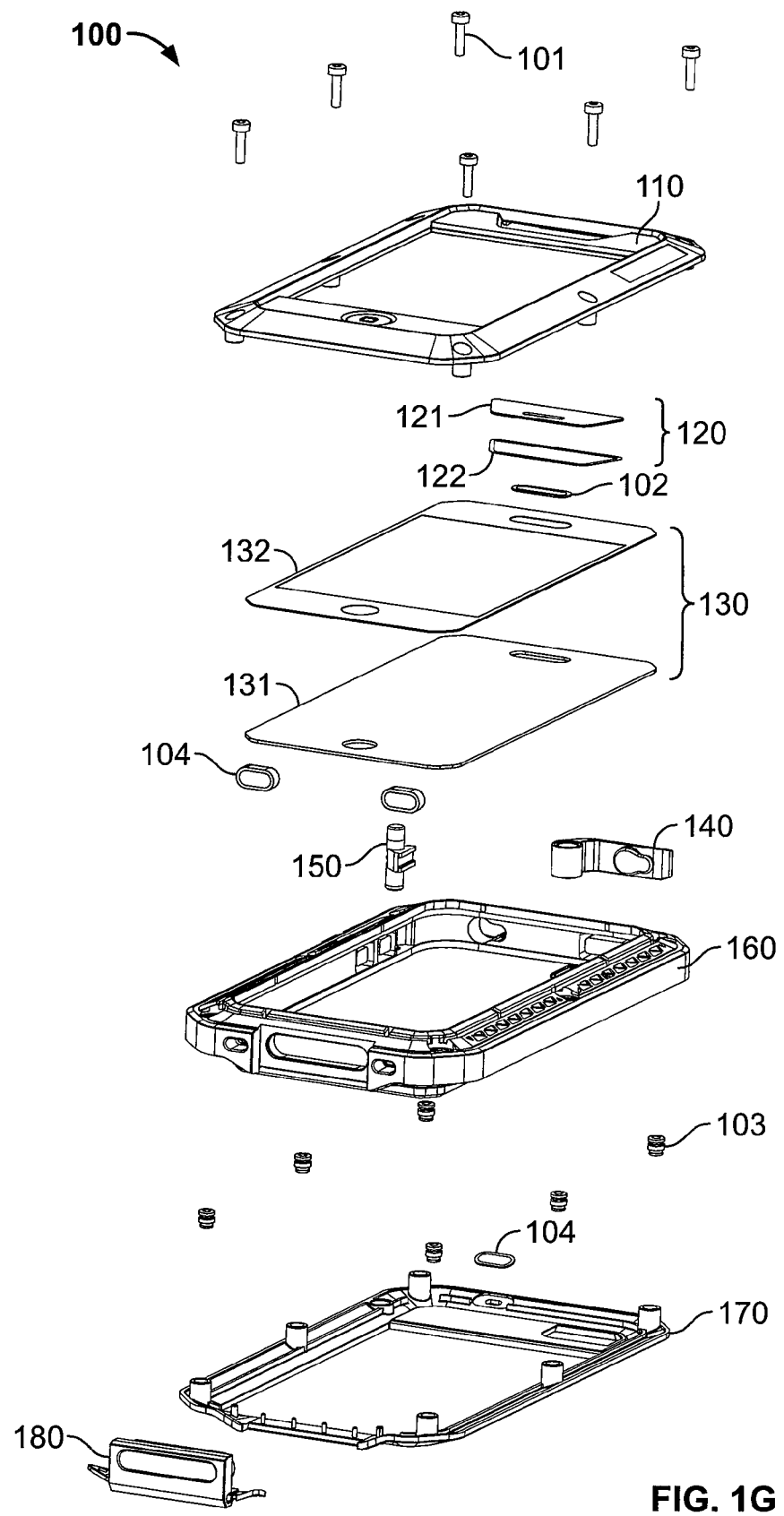
Figure 2A:
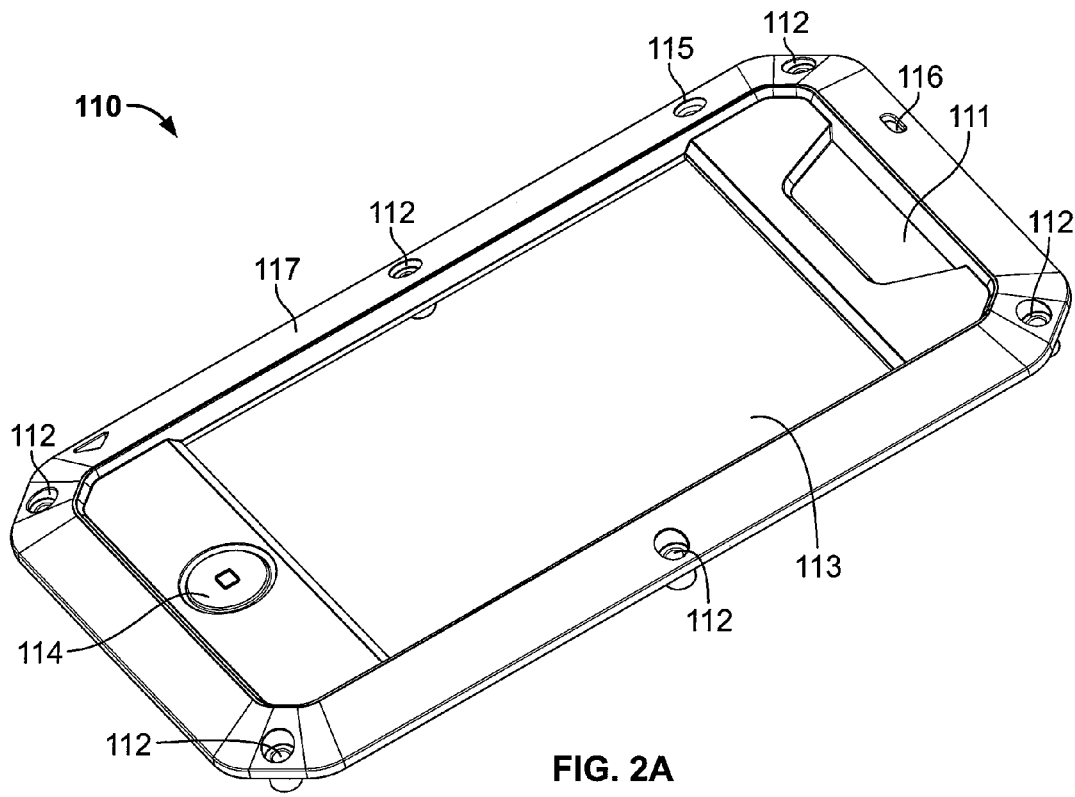
FIGS. 2A and 2B illustrate an anterior portion of a portable electronic device case, according to techniques of the present application.
Figure 2B:
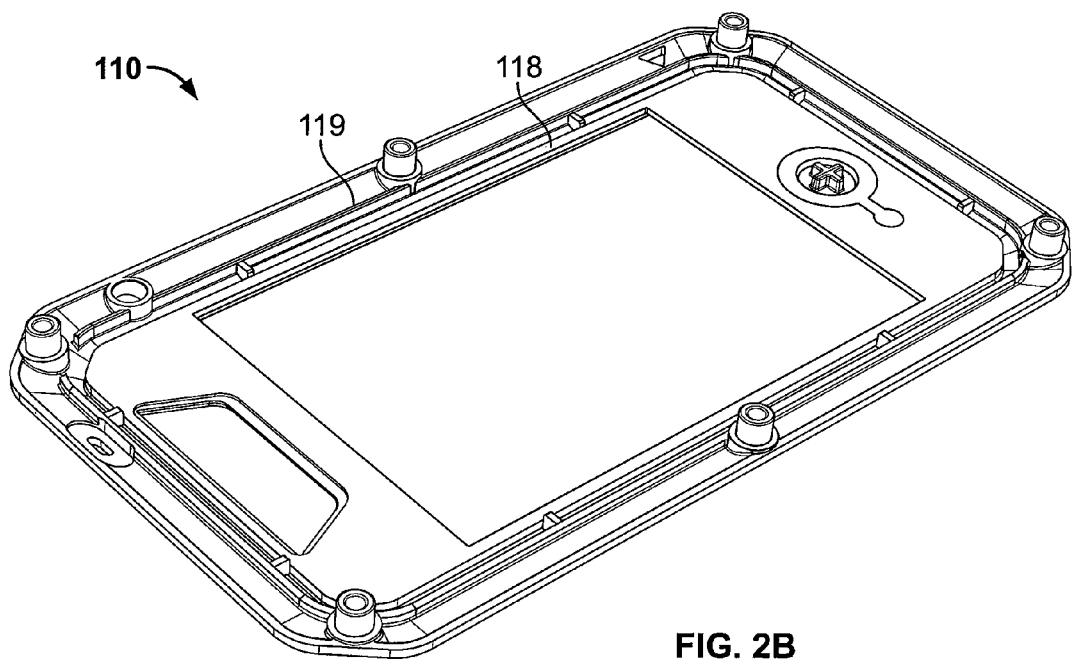

FIGS. 1A-1G illustrate different views of a portable electronic device case 100 (or, more simply, "case"), according to techniques of the present application. FIG. 1A is a perspective view of the front of the case 100. FIG. 1B is a perspective view of the rear of the case 100. FIG. 1C is an elevation view of the front of the case 100. FIG. 1D is an elevation view of the rear of the case 100. FIG. 1E is an exploded cross-sectional view of the case 100. FIG. 1F is a cross-sectional view of the case 100. FIG. 1G is an exploded perspective view of the case 100.

The case 100 may include an anterior portion 110, a receiver lens 120, a transparent covering portion 130, an audio port cover 140, a vibration switch actuator 150, a boot 160, a posterior portion 170, and a communications interface door assembly 180. The case 100 may be designed to accommodate a wireless communication device 10 (or, more simply, "device"), such as a smart phone. While not limiting, the figures generally show a case 100 that accommodates the iPhone® 4 or 4S.

Generally, the case 100 may protect the device 10 from contamination. The device 10 may fit into the boot 160. The transparent covering portion 130 may be aligned over the screen of the device 10. The anterior and posterior portions 110, 170, may sandwich the boot 160 and the transparent covering portion 130. Thus, the boot 160 and the transparent covering portion 130 may be between the anterior portion 110 and posterior portion 170. By "between," it should be understood that the boot 160 and the transparent covering portion 130 need not be completely between or directly abutting the anterior portion 110 and/or posterior portion 170. The boot 160 and transparent covering portion 130 may be between the anterior portion 110 and the posterior portion if only a portion of the boot 160 and transparent covering portion 130 is between the anterior portion 110 and/or the posterior portion 170. The boot 160 and transparent covering portion 130 may be between the anterior portion 110 and/or the posterior portion 170 if the boot 160 and transparent covering portion 130 are between only a portion of the anterior portion 110 and/or the posterior portion 170. Fasteners 101 (for example, bolts or socket head bolts) may be used to compress the device 10 and different parts of the case 100 together to enclose the device 10.

As shown in FIGS. 1E and 1F, the device 10 may fit in the boot 160. The anterior portion 110 and the posterior portion 170 may fit on or mate with the boot 160. The transparent covering portion 130 may lie over the device 10. The anterior portion 110 may include a lip 118 that compresses the transparent covering portion 130 onto the screen of the device 10 as the fasteners 101 are tightened.

As shown in FIG. 1G, the receiver lens 120 may include a lens 122 (for example, acrylic or polycarbonate) and an adhesive 121. The transparent covering portion 130 may include a lens 131 (for example, Gorilla Glass') and an adhesive 132. The case 100 may include various coverings 104 which may substantially protect the device 10 from contaminants. One or more of the coverings 104 may be substantially acoustically transparent or transmissive. Such coverings 104 may include a material such as Gore GAW324.

The boot 160 is illustrated in greater detail in FIGS. 1E, 1F, 5A and 5B. The boot 160 may include a rear panel 161, a sidewall 162, a flange 163, and grooves 164. The rear panel 161 may fit against the back of the device 10. The rear panel 161 may include a rear window 161b and a rear window seal 161a. The rear window 161b may allow access (for example, access for light, sound, or touch) to a camera or light source on the device 10. The rear window seal 161a may form a seal (to protect against contaminants) with the device 10 in response to the rear window seal 161a being compressed against the device 10.

The sidewall 162 may wrap around the lateral sides of the device 10. There may be a flange 163 that extends from a top region of the sidewall 162. The rear panel 161, sidewall 162, and flange 163 may form a cavity. Outer regions of the device 10 may fit into the cavity, thereby securing the boot 160 to the device 10. The boot 160 may include a material such as an elastomer. For example, the boot 160 may include silicone. The boot 160 may be relatively flexible or may have a hardness of approximately 65 as measured by a durometer on a Shore A scale. The boot 160 may be formed as one unitary piece. The boot 160 itself may be used as a case, for example, without the anterior portion 110, transparent covering portion 130, and/or posterior portion 170.

Figure 5A:
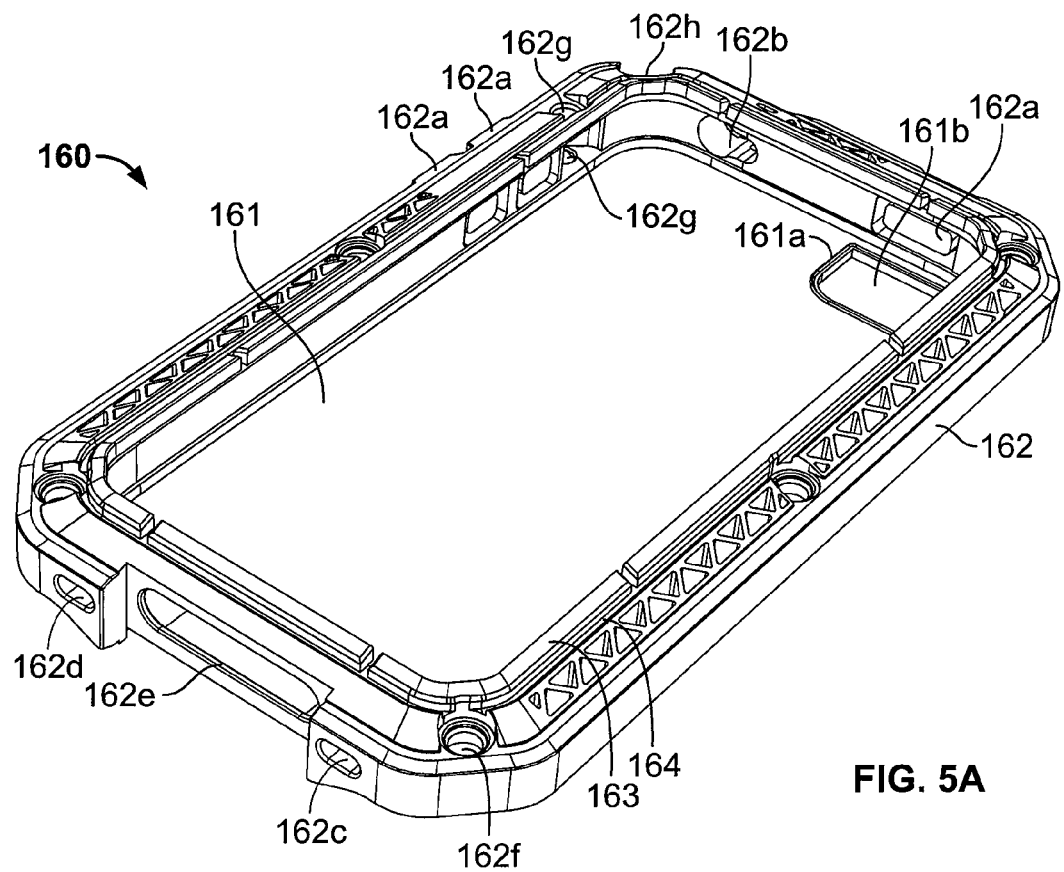
FIGS. 5A and 5B illustrate different views of a boot portion of a portable electronic device case, according to techniques of the present application.

The sidewall 162 may or may not be solid. The sidewall 162 may include hollow regions. Also, the inner and outer contours of the sidewall 162 may include nooks, crannies, or other uneven contours. At least some of these areas may be considered to be part of the sidewall 162. For example, as can be seen in FIG. 5A, a hollow area on the inside of the sidewall 162 can be seen proximate the vibration switch actuator apertures 162g. This hollow region and the parts above and below this hollow region may be considered part of or included in the sidewall 162.

The sidewall 162 may include one or more actuators 162a. Each actuator 162a may be pressed or released by a user to cause corresponding switches or buttons on the device 10 to be pressed or released. For example, the actuators 162a may interface with volume control or power control buttons or switches on the device 10. Each actuator 162a may receive an actuation force from a user. The actuator 162a may then translate the actuation force towards a switch or a button on the device 10.

The sidewall 162 may include an audio port aperture 162j, which opens into a hollow region 162b to allow access to an audio port (for example, a headset jack socket) in the device 10. The device 10 may have a microphone proximate to the audio port. This microphone may be used in conjunction with noise cancellation processes to improve audio quality (for example, call quality) from the device. The audio port aperture 162j may allow access to this microphone as well. If the audio port aperture 162j is sealed (for example, with the plug 142 of the audio port cover 140), the microphone may not effectively receive ambient noise. Consequently, the device 10 may not be able to perform effective noise cancellation.

To address this issue, the boot 160 may include one or more acoustic piping apertures 162*i* into the hollow region 162*b*—for example, one acoustic piping aperture 162*i* on the front side of the boot 160 and one acoustic piping aperture 162*i* on the back side of the boot 160. The acoustic piping aperture 162*i* may allow sound to pass into the hollow region 162*b* and to the microphone proximate the audio port, even when the audio port aperture 162*j* is sealed. Corresponding acoustic piping apertures 116, 175 may be provided in the anterior portion 110 and posterior portion 170 respectively. Thus, the apertures 116, 175, and 162*i* may allow noise cancellation to continue working even when the audio port aperture 162*j* has been sealed, for example, with the plug 142 of the audio port cover 140.

To protect against contamination entering through the acoustic piping aperture(s) 162*i*, microphone hole coverings 104 may be used in conjunction with the acoustic piping apertures 162*i*. These coverings 104 may be substantially acoustically transparent or transmissive. Such coverings 104 may include a material such as Gore GAW324. On the back side, a hole covering 104 may fit between the boot 160 and the posterior portion 170 (for example, in a recessed area around a corresponding acoustic piping aperture in the posterior portion 170). On the front side, a hole covering 104 may fit between the boot 160 and anterior portion 110 (for example, in a recessed area around a corresponding acoustic piping aperture in the anterior portion 110).

The sidewall 162 may include a speaker aperture 162*c* and a microphone aperture 162*d*. These apertures 162*c*, 162*d* may allow sound to pass to and from a microphone or speaker on the bottom of the device 10. The speaker aperture 162*c* and microphone aperture 162*d* may accommodate coverings 104. These apertures may also accommodate inserts that carry the coverings. The coverings 104 may be secured in the boot 160 by inserting them into the apertures 162*c*, 162*d* from the inside of the boot 160 and then inserting the carriers into the apertures 162*c*, 162*d* from the inside. The apertures 162*c*, 162*d* may include ledges in the boot 160 that prevent the coverings 104 and carriers from being inserted too far into the boot 160 (or coming out the other side).

The sidewall 162 may include a communications interface aperture 162*e* that allows access to a communications port on the device 10 (for example, a 30-pin communications port). The sidewall 162 may also include a plurality of fastener apertures 162*f* that accommodate the fasteners 101 or accommodate the risers on the anterior portion 110. Note, risers could also be on the posterior portion 170 or could be separate portions altogether. The sidewall 162 may include a plurality of vibration switch actuator apertures 162*g* (one on the front and one on the back) and an audio port cover recess 162*h*.

The sidewall 162 may also include a bumper 166. The bumper 166 may extend along any part of the sidewall 162. As shown, the bumper 166 extends along portions of the left, right, and top portions of the sidewall 162 of the boot 160. The bumper 166 may include air pockets or hollow regions 166*b* within the sidewall 162 of the boot 160. The bumper 166 may make the case 100 more shock resistant to impacts (for example, lateral-side impacts). The appearance of the bumper 166 shown in the drawings is one of many ornamental appearances of a bumper 166 that may be employed to achieve improved shock resistance.

Figure 5B:
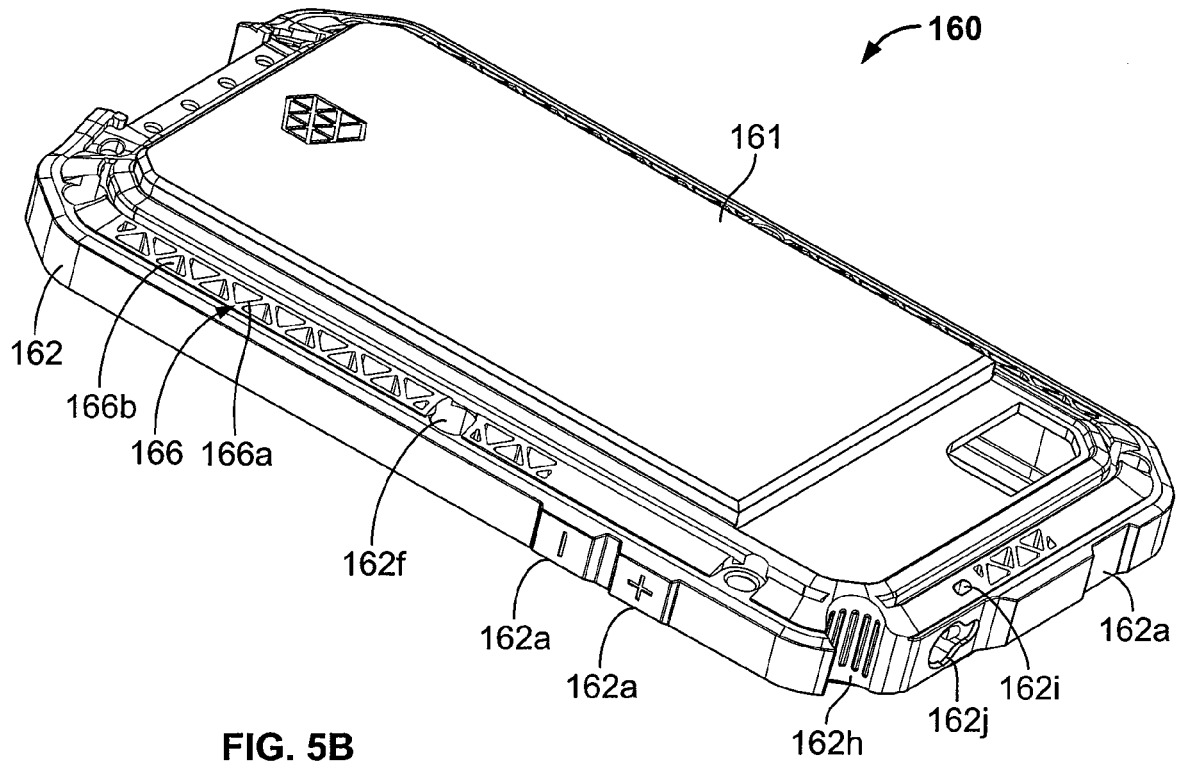
Figure 8:
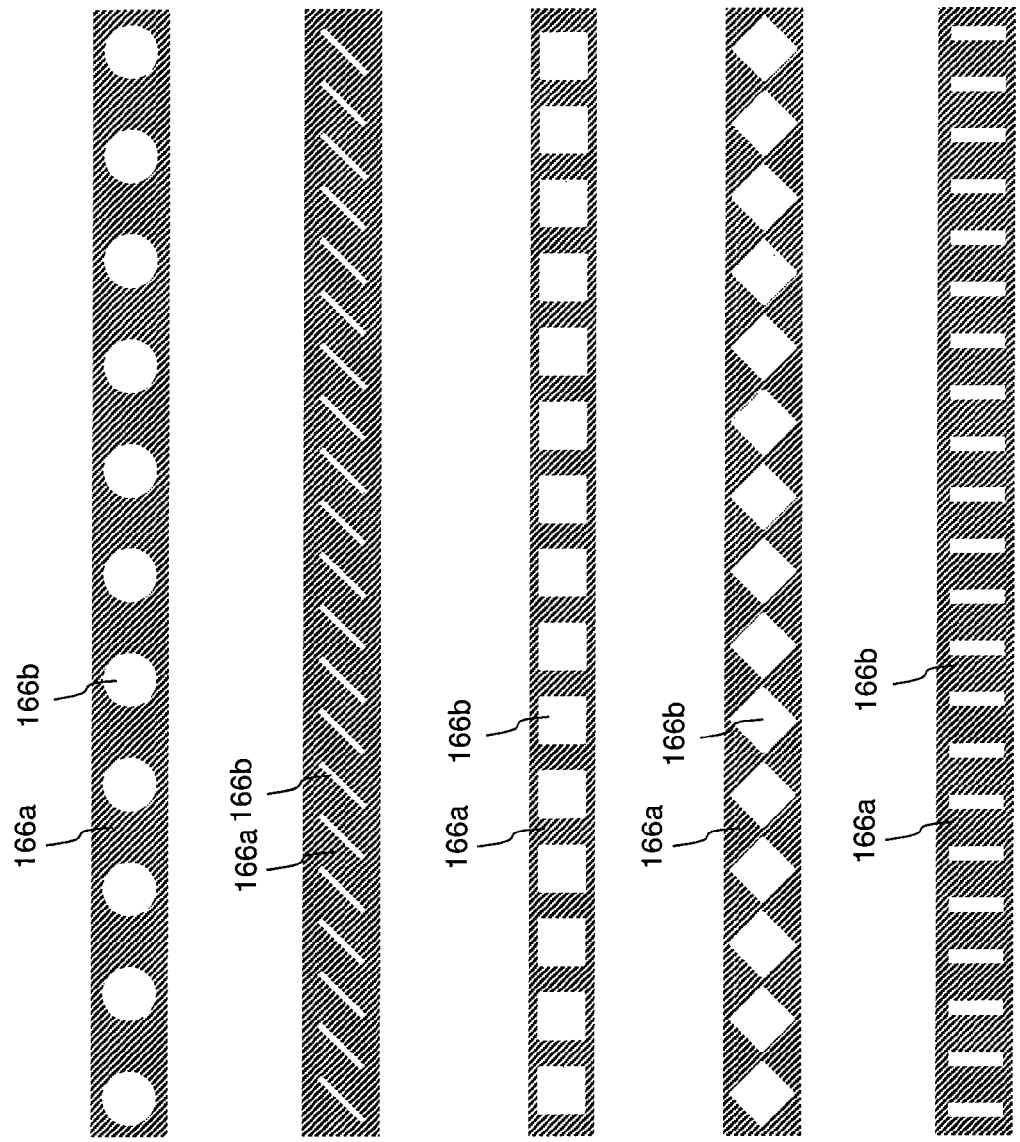
FIG. 8 illustrates different embodiments of a bumper of the boot portion shown in FIGS. 5A and 5B.

As shown in FIGS. 5A and 5B, the bumper 166 may have a trussed design with partitions 166*a* (for example, trussed or zigzagging partitions) separating the hollow regions 166*b*. As shown in FIG. 8, the bumper 166 may have other designs, such as air pockets 166*b* that are circular areas, diagonal line areas, rectangular areas, diamond areas, and straight line areas. The shape of the hollow regions 166*b* may determine the shape of the partitions 166*a*. These are just a few illustrative examples. Various other shapes (either regular or irregular) or combinations of shapes may be used.

The anterior portion 110 is illustrated in FIGS. 1E, 1F, 2A and 2B. The anterior portion 110 may include a receiver window 111 and fastener apertures 112. The receiver window 111 may provide access (for example, access for light, sound, or touch) to an earpiece speaker and/or camera of the device 10. The fastener apertures 112 may receive fasteners 101 (for example, bolts). A fastener aperture 112 may include a riser portion and a cup portion. An elongated portion of a fastener 101 may extend through the riser portion, while a head of the fastener may rest in the cup portion.

The anterior portion 110 may also include a screen window 113 and an actuator 114. The screen window 113 may provide access (for example, access for light, sound, or touch) to a screen of the device 10 or to the transparent covering portion 130. A user may interact with the screen of the device 10 through the screen window 113. The actuator 114 may be pressed or released by a user to cause a corresponding switch or button on the device 10 to be pressed or released. The actuator 114 may receive an actuation force from a user. The actuator 114 may then translate the actuation force towards a switch (for example, a home button) on the portable electronic device 10.

The anterior portion 110 may include a vibration switch actuator aperture 115 and an acoustic piping aperture 116. The vibration switch actuator aperture 115 may receive a post 151 of a vibration switch actuator 150. The acoustic piping aperture 116 may operate in conjunction with a corresponding acoustic piping aperture 162*i* of the boot 160. The operations and configurations of these apertures will be discussed in greater detail below.

The anterior portion 110 may include a bezel 117, a lip 118, and a ridge 119. The bezel 117 may have a beveled profile and may slope downwards from the top elevation of the anterior portion 110 towards the boot 160. As can be seen in FIGS. 1E and 1F, the lip 118 may extend downwards from the top elevation of the anterior portion 110. The lip 118 may be configured to extend past the flange 163 of the boot 160. The bottom surface of the lip 118 may compress an outer region of the transparent covering portion 130 against the device 10. The ridge 119 may be configured to mate with a corresponding groove 164 in the boot 160. The ridge 119 may include one or more ribs which also mate with the corresponding groove 164.

The audio port cover 140 is illustrated in FIG. 3. The audio port cover 140 may include an audio port cover 140 aperture 143 and an arm 141. A portion of the audio port cover around the aperture 143 may fit within the audio port cover recess 162*h* in the boot 160. The audio port cover aperture 143 may secure to another portion of the case 100, such that the arm 141 may rotate about the audio port cover aperture 143 and along a primary plane of the boot 160. A fastener 101 or a riser encompassing a fastener may extend through the audio port cover aperture 143.

The audio port cover 140 may also include a handle 144 and a plug 142. The handle 144 may facilitate the operation of opening and closing the audio port cover 140. When at one extent of the rotation of the audio port cover arm 141, the plug 142 may engage in the audio port aperture 162*j* of the boot 160 so that the audio port of the device 10 may be protected from contaminants.

The vibration switch actuator 150 is illustrated in FIG. 4A. The vibration switch actuator 150 may include a post 151, a vibration switch cup 152, and vibration switch detents 153. The vibration switch cup 152 may be located on or within a lateral side of the post 151. The vibration switch cup 152 may be configured to receive a vibration switch on the device 10. The detents 153 may be located on or within the post 151. The detents 153 may include an ON detent and an OFF detent.

The vibration switch actuator 150 is illustrated in conjunction with the boot 160 in FIG. 4B. The boot 160 may accommodate the vibration switch actuator 150 through the vibration switch actuator apertures 162g. The vibration switch actuator 150 may slidably move transversely across the sidewall 162 as the post 151 slides through the vibration switch actuator apertures 162g. The boot 160 may include wiper seals 168 near or as part of the vibration switch actuator apertures 162g. The wiper seals 168 protect against contaminants by forming a seal and wiping contaminants off of the post 151 as the post 151 moves across the wiper seals 168.

The boot 160 may include a stop nub 167 that engages the detents 153. The stop nub 167 may alternately snap into the ON detent 153 or the OFF detent 153 as the vibration switch actuator 150 moves transversely across the sidewall 162. The stop nub 167 may assist in stopping movement of the vibration switch actuator 150. The vibration switch cup 152 may also assist in stopping movement when it abuts the boot 160. When the stop nub 167 snaps into a detent 153, it may cause a physical pulse. Such a pulse may provide tactile feedback to a user to indicate a change in position of the vibration switch actuator 150 and the corresponding vibration switch on the device 10.

Figure 6:
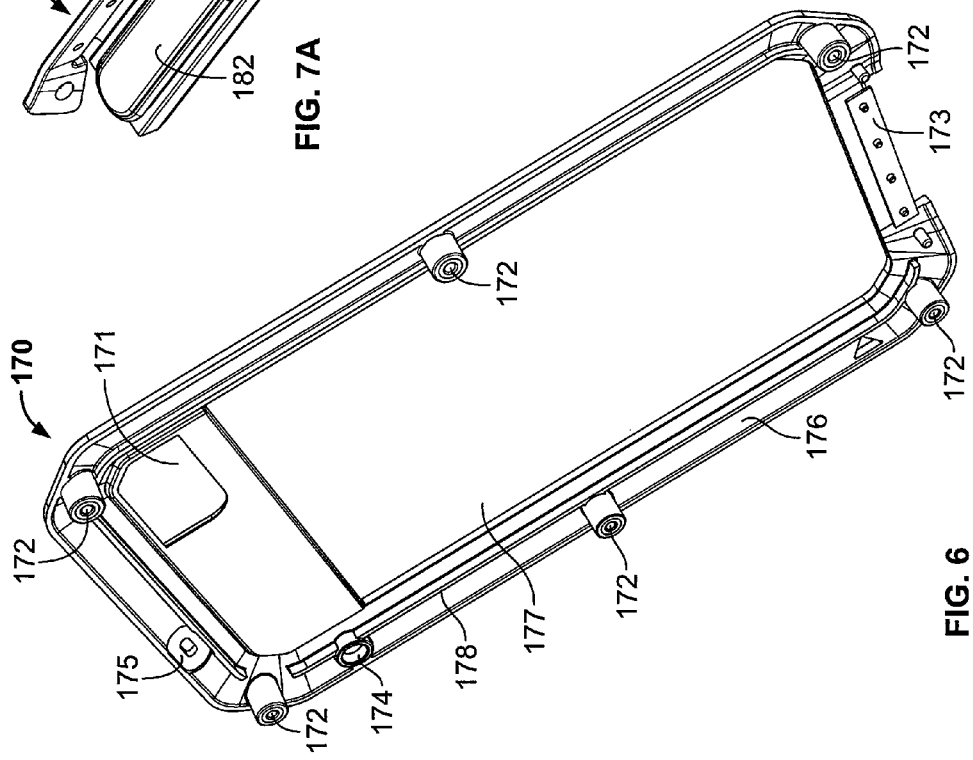
FIG. 6 illustrates a posterior portion of a portable electronic device case, according to techniques of the present application.

The posterior portion 170 is illustrated in FIG. 6. The posterior portion 170 may include a rear aperture 171 and fastener receptacles 172. The rear aperture 171 may provide access (for example, access for light, sound, or touch) to a camera or light source on the back of the device 10. The fastener receptacles 172 may be threaded, and may receive the fasteners 101. The fastener receptacles may also receive inserts (shown, for example, as 103 in FIG. 1G), which, in turn, receive the fasteners 101. While the case 100 is illustrated with fastener heads accessible from the front of the case 100, it would also be possible to reverse the fasteners 101 and corresponding portions on the anterior portion 110 and the posterior portion 170, such that the fastener heads are accessible from the back of the case 100.

The posterior portion 170 may also include a ridge 178. As can be seen in FIGS. 1E and 1F, the ridge 178 may be configured to mate with a corresponding groove 165 in the boot 160. The ridge 178 may include one or more ribs which also mate with the corresponding groove in the boot 160.

The posterior portion 170 may also include a communication door assembly connecting portion 173, a vibration switch actuator aperture 174, and an acoustic piping aperture 175. The communication door assembly connecting portion 173 may connect with the communication door assembly 180. The vibration switch actuator aperture 174 may correspond to a similar aperture 162g in the boot 160, and may accommodate the post 151 of the vibration switch actuator 150. The acoustic piping aperture 175 may correspond to a similar aperture 162i in the boot 160.

The posterior portion 170 may also include a bezel 176 and a window 177 to accommodate a rear panel 161 of the boot 160. The bezel 176 may have a beveled profile and may slope upwards from the bottom elevation of the anterior portion 110 towards the boot 160. The window 177 may allow the rear panel 161 of the boot 160 to be directly accessible to a user.

Figure 7A:
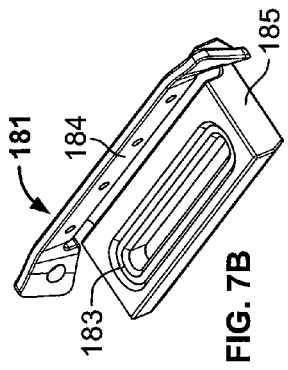
FIGS. 7A-7C illustrate a communications interface door assembly of a portable electronic device case, according to techniques of the present application.
Figure 7C:
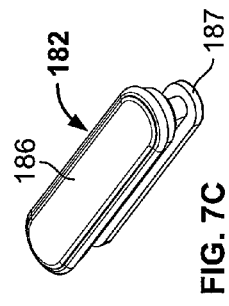
Figure 7B:
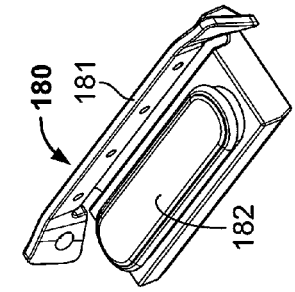

The communications interface door assembly 180 is illustrated in FIGS. 7A-7C. The communications interface door assembly 180 may include a hinged portion 181 and a plug 182. The hinged portion 181 may include a connecting portion 184, a door 185, and a plug receiving portion 183 configured to receive the plug 182. The hinged portion 181 may be flexible and may include a material such as silicone. The hinged portion may include a living hinge between the connecting portion 184 and the door 185. The connecting portion 184 may connect with the corresponding connecting portion 173 on the posterior portion 170.

The door 185 may include the plug receiving portion 183 which is configured to receive the plug 182. The plug 182 may be rigid. The plug 182 may include a material such as anodized aluminum. The plug 182 may include a door mating portion 187 that mates with the plug receiving portion 183 on the door 185. The plug 182 may also include a port cover portion 186 that fits through the communication port aperture 162e of the boot 120 and covers the communications port on the device 10.

Figure 9:
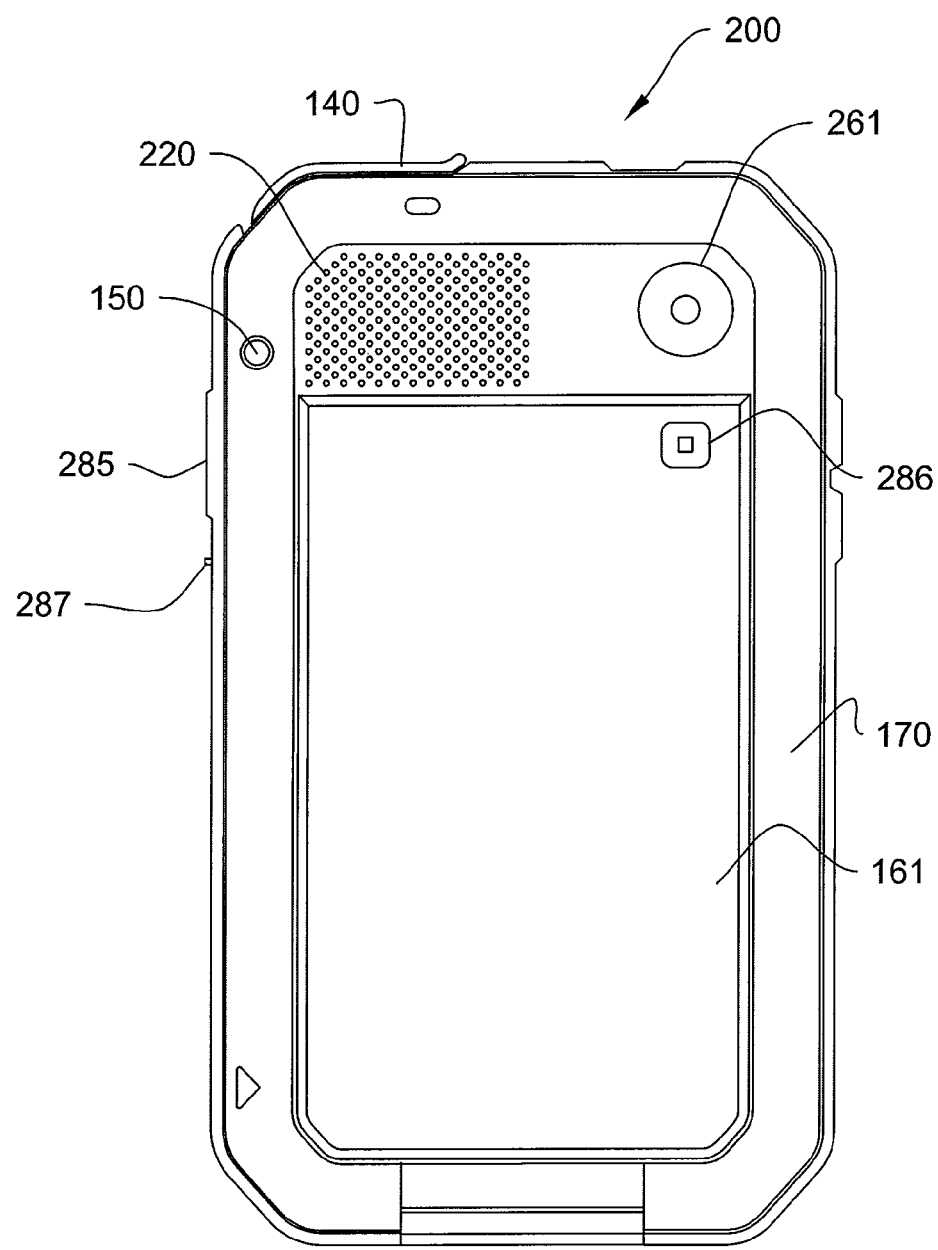
FIG. 9 illustrates an elevation view of a rear of the portable electronic device case in accordance with one embodiment.
Figure 12:
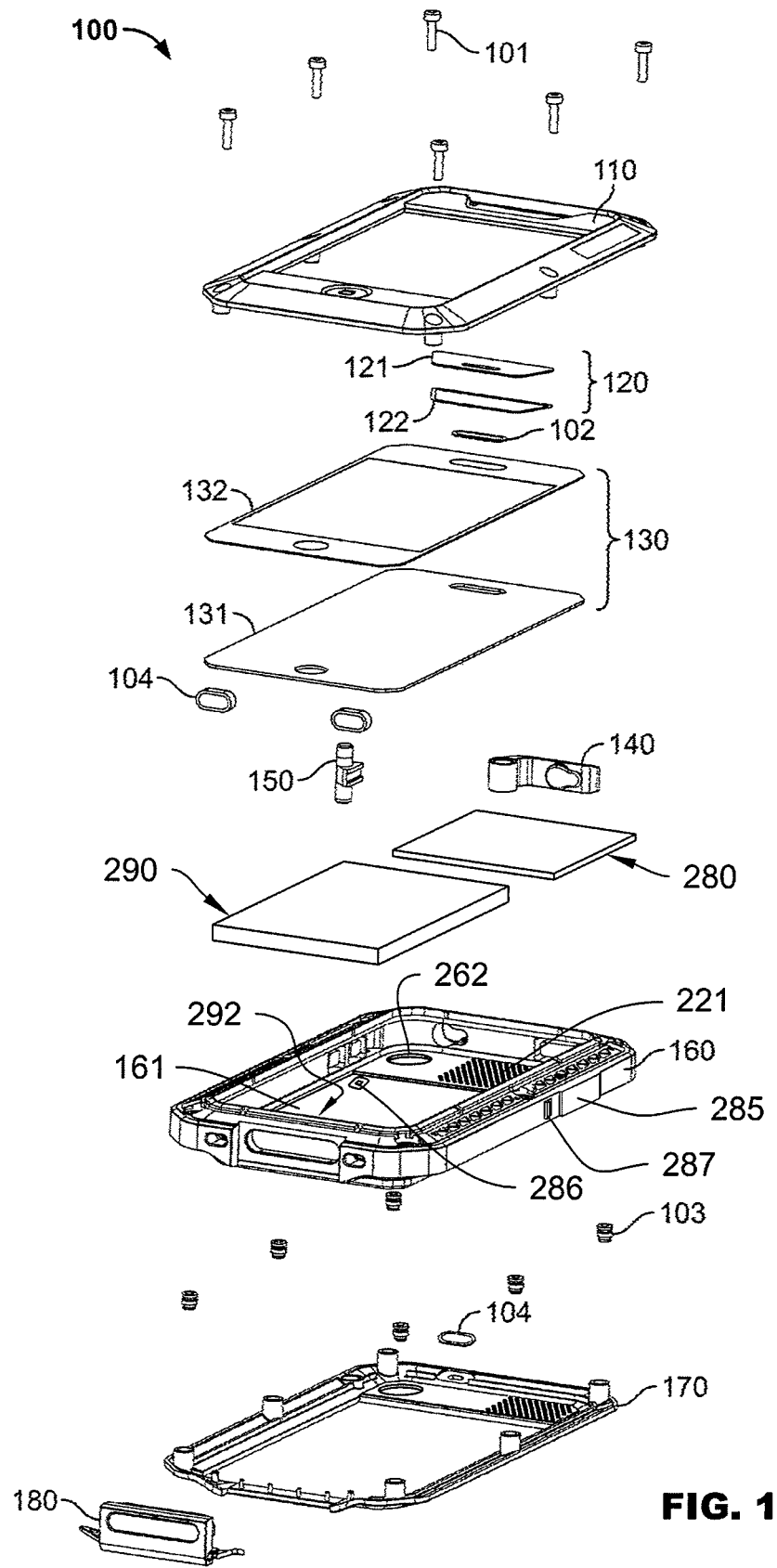
FIG. 12 illustrates an exploded perspective view of the portable electronic device case shown in FIG. 9.
Figure 13:
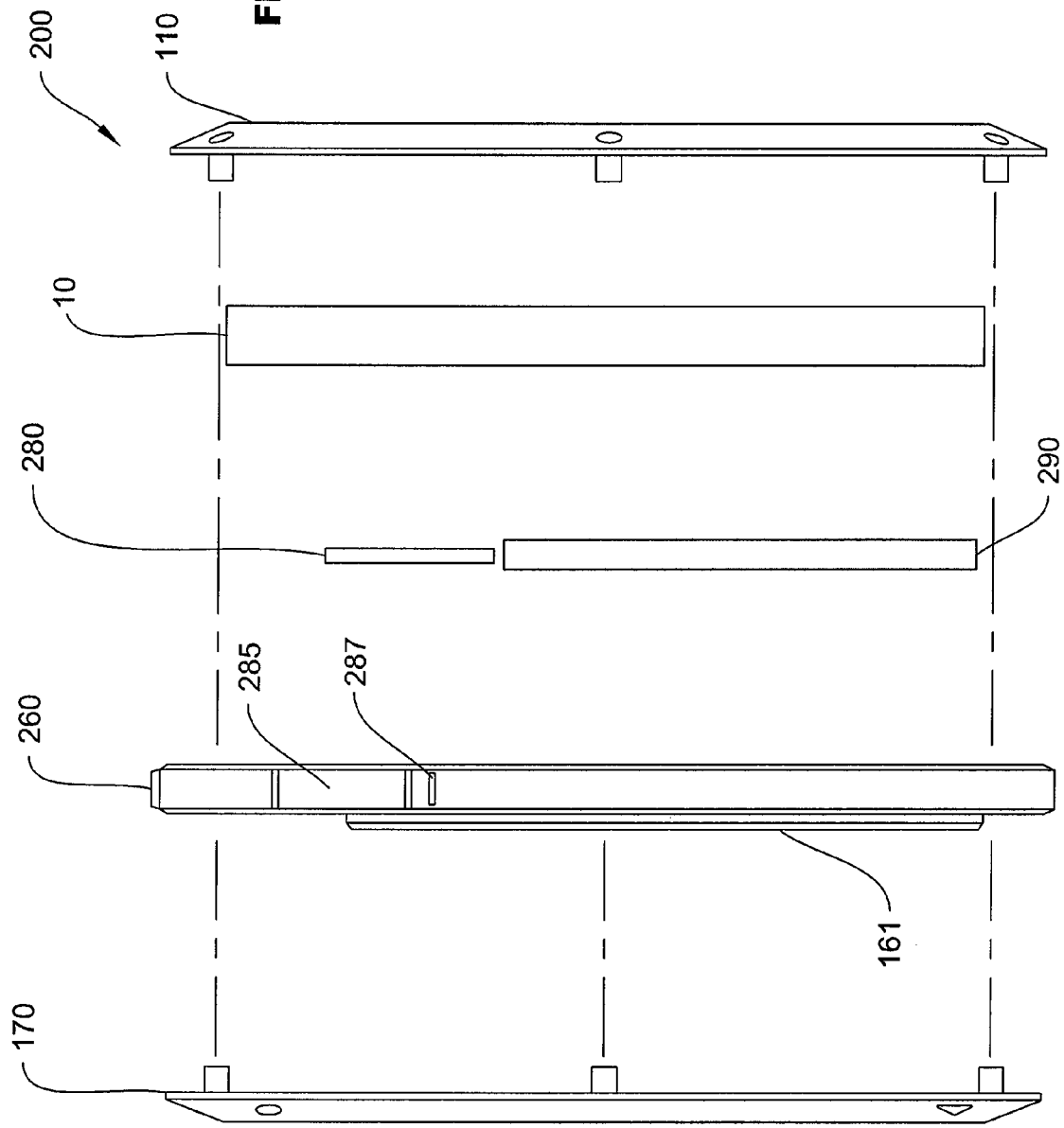
FIG. 13 illustrates an exploded side view of the portable electronic device case shown in FIG. 9.
Figure 14:
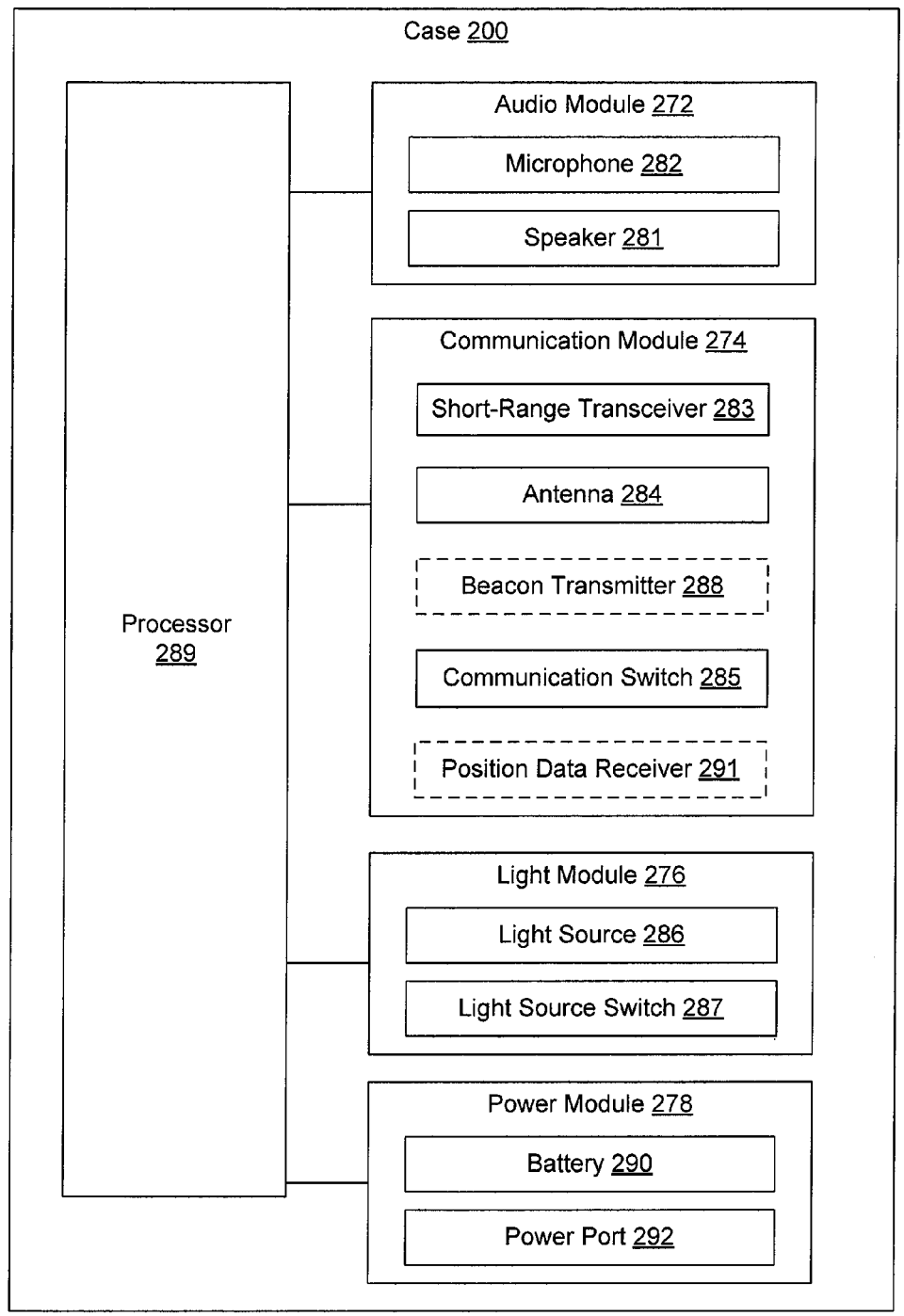
FIG. 14 illustrates a block diagram of the portable electronic device case shown in FIG. 9.

FIG. 9-14 illustrate different views of a protective case 200 (or, more simply, "case") for housing the wireless communication device 10 according to techniques of the present application. FIG. 9 is an elevation view of a rear of the case 200. FIGS. 10A and 10B are perspective views of the rear of the case 200. FIGS. 11A and 11B are perspective views of a boot portion 260 of the case 200. FIG. 12 is an exploded perspective view of the case 200. FIG. 13 is an exploded side view of the case 200. And FIG. 14 represents a block diagram of a component-level view of the case 200.

The case 200 may include several of the same components as the case 100, including, for example, the anterior portion 110, the audio port cover 140, the vibration switch actuator 150, the rear panel 161, the sidewall 162, and the posterior portion 170. As shown in FIG. 13. the anterior portion 110 may fit over a front face of the device 10, the boot portion 260 may fit over a rear face of the device 10, and the posterior portion 170 may fit over a back side of the boot portion 260.

The case 200 may further include a speaker cover 220 and a camera aperture 261. The speaker cover 220 and camera aperture 261 may be included in the posterior portion 170 of the case 200. The boot portion 260 may include a speaker cover 221 that correspondingly fits under the speaker cover 220 when the posterior portion 170 is attached to the boot portion 260. Accordingly, the speaker covers 220, 221 may provide an audio opening for a speaker 281 included within the case 200. Similarly, the boot portion 260 may include a camera aperture 262 that correspondingly fits under the camera aperture 261 when the posterior portion 170 is attached to the boot portion 260. Accordingly, the camera apertures 261, 262 may provide access to a camera (not shown) on the back of the device 10.

As shown in the figures, for example, FIGS. 1B and 9, the locations of the camera apertures 261, 262, the audio port cover 140, and other features of the case 100, 200 may be altered depending on the placement of corresponding components within the device 10. For example, the location of the aperture 261 may move from a left side (rear aperture 171 in FIG. 1B) to a right of the back of the case 100, 200 to accommodate a device that has a camera located on a right side of the back of the device. Similarly, the location of the speaker covers 220, 221 may vary depending on the location of the speaker 281 within the case 200.

As shown in FIG. 14, the case 200 may include an audio module 272, a communications module 274, a light module 276, and a power module 278. These modules, and the components thereof, may be integral to the case 200 and capable of functioning independently of the device 10. For example, the communication module 274 may be capable of transmitting and receiving wireless communication signals without the assistance of any wireless communication circuitry within the device 10. Similarly, the audio module 272 may be capable of, for example, reproducing audio without the aid of any speakers included in the device 10.

As shown in FIGS. 12 and 13, the case 200 may include a printed circuit board 280. The printed circuit board 280 may include at least a portion of the audio module 272, the communications module 274, the light module 276, and the power module 278. For example, one or more of the components included within the modules 272, 274, 276, and 278 may be mounted on the printed circuit board 280. Further, the printed circuit board 280 may include interconnects and connectors for connecting two or more of the modules 272, 274, 276, and 278 to each other. For example, the audio module 272 and the communications module 274 may be operatively coupled via the printed circuit board 280 in order to carry out a communication function of the case 200, as described in more detail below.

The audio module 272 may include various components related to an audio function of the case 200. For example, the audio module 272 may include a speaker 281 that is configured to reproduce audio signals. According to one embodiment, the speaker 281 may be a loud speaker that produces sound up to 100 decibel (dB). The audio module may also include an integral microphone 282 that is configured to capture audio signals. According to one aspect, the speaker 281 may reproduce audio signals received by the communications module 274, and the communications module 274 may transmit the audio signals captured by the microphone 282.

The communications module 274 may include various components for implementing the communication function associated with the case 200. According to one aspect, the communications module 274 may include wireless communications circuitry for facilitating communication between the case 200 and one or more remote communication devices via, for example, a short range network. The remote communication devices may include wireless communication devices, such as, mobile telephones, smartphones, tablets, portable computers, portable or handheld radios (including walke-talkies, amateur radios, etc.), and the like. The one or more remote communication devices may be associated with one or more people or "contacts" known by a user of the device 10. Each remote communication device may be associated with contact information. At least a portion of the contact information may be used by the case 200 to communicate with the remote communication device. The case 200 may access the contact information, which may be stored on a memory of the encapsulated device 10. For example, the contact information may include a cellular telephone number, a short range network identifier (e.g., a unique code, a user ID, etc.) provided for identification over the short range network, a name, an address, etc. In one embodiment, the communication module 274 of the case 200 operates upon losing cellular network coverage (e.g., once the device 10 is "off the grid"). In another embodiment, the communication module 274 operates regardless of the existence of cellular network coverage.

Thus, the case 200 may be in not just physical but also electronic contact with the device 10 contained therein. This allows the case to access the onboard memory of the device 10, as well as to use the device to facilitate certain interfaces with the user, as contemplated and discussed herein. Such electronic communication may be wired (such as via attachment through a connector port connected when the device 10 is installed within the case 200), or wireless, such as by blue-tooth connection or near field communication.

According to some aspects, the wireless communications circuitry of the case 200 includes a short-range transceiver 283, which may be configured for short-distance, two-way communication between the short range transceiver 283 and other remote communication devices having short range communication capabilities. The short-range transceiver 283 may operate on different frequency bands, have different power ratings, and/or have different physical ranges depending on the short range communication technology utilized by the transceiver.

For example, according to one aspect, the short-range transceiver 283 may be configured for Family Radio Service (FRS). FRS is a lower power short range radio service that typically offers 500 milliwatts (mW) of power and typically operates within ultra high frequency (UHF) bands around 467 MHz (e.g., 467.5625 MHz to 467.7125 MHz). An FRS radio may have a range of up to 1.5 kilometers (km). This range can be reduced by the presence of large buildings, trees, and other objects that block a line of sight between the FRS radio and other communication devices, or increased by exceptional conditions, such as hilltop to hilltop communication. For example, in urban areas with minimal light of sight, the range may be up to 0.3 miles, and in areas with optimal line of sight (e.g., from a mountain to a valley), the range may be up to 1 mile.

According to another aspect, the short range transceiver 283 may be configured for General Mobile Radio Service (GMRS). GMRS is a higher power short range radio service that typically offers 1 to 2 watts (W) of power and typically operates within a frequency band around 462 MHz (e.g., 462.5625 MHz to 462.7125 MHz). A GMRS radio may have a range between 8 km and 35 km. As with FRS radios, this range can be reduced by line of sight obstructions, such as trees, hills, and buildings, and increased in higher regions. For example, in urban areas with minimal light of sight, the range may be up to 5.8 miles, and in areas with optimal line of sight, the range may be up to 18 miles. The higher power capability of the GMRS radio may help improve the reliability of communication in situations with limited line of sight.

According to yet another aspect, the short-range transceiver 283 may be configured for both FRS and GMRS and thereby, may operate in both the 462 MHz and 467 MHz frequency bands. FRS and GMRS utilize channelized frequencies that are reserved for short-range communication (twenty-two channels in total) and in some cases, share the same frequency channels. For example, channels 1 through 7 are available for both FRS and GMRS radios, while channels 8 through 14 are reserved for FRS radios only and channels 15 through 22 are reserved for GMRS radios only. In embodiments where the short-range transceiver 283 is configured for both FRS and GMRS operation, the transceiver 283 may be tuned to operate in all twenty-two channels. According to one embodiment, the short-range transceiver 283 may be configured to selectively operate in either the FRS or the GMRS mode, depending on various factors programmed into a software application associated with the case 200.

As shown in FIG. 14, the communications module 274 may further include an integral antenna 284 that is configured to transmit and/or receive signals over the frequency band(s) supported by the short-range transceiver 283. For example, in embodiments where the short-range transceiver 283 operates using FRS technology, the antenna 284 may be tuned to transmit and receive signals over the 467 MHz band. As another example, in embodiments where the short-range transceiver 283 operates using GMRS technology, the antenna 284 may be tuned to transmit and receive signals over the 462 MHz band. Further, in embodiments where the short-range transceiver 283 operates using both FRS and GMRS technology, the antenna 284 may be tuned to transmit and receive signals over both the 467 MHz and the 462 MHz bands. The antenna 284 may be any type of antenna, including, for example, loop, inverted-F, dipole, monopole, etc., and may be integrated into the case 200.

The communication module 274 may further include a communications switch 285 that is operatively coupled to the short-range transceiver 283. The communications switch 285 may be configured to enable or activate communication over one or more wireless communication networks via the wireless communication circuitry included in the communications module 274. For example, the communications switch 285 may be configured to activate the short-range transceiver 283 for communicating over an FRS and/or a GMRS network.

The communications switch 285 may be implemented in software or hardware. As an example, the communications switch 285 may include a switch, button, knob, lever, key, or other device for controlling the communication function of the case 200. In some embodiments, the communications switch 285 may be a depressible button, such as, for example, a push-to-talk (PTT) button. In such embodiments, pressing the communications switch 285 may initiate a transmission mode of the short-range transceiver 283. In one embodiment, releasing the communications switch 285 may initiate a receiving mode of the short-range transceiver 283. Other functions of the communications switch 285 may also be possible. For example, actuating the communications switch 285 may open up a continuous two-way communication path between the short-range transceiver 283 and another remote communications device, so that the transceiver 283 is simultaneously receiving and transmitting signals.

As another example, in one embodiment, the communications switch 285 may be automatically engaged when the device 10 loses connection to a cellular communication network for at least a pre-determined amount of time (e.g., 2 minutes, 5 minutes, 10 minutes, etc.). According to such embodiment, the communications switch 285 may be associated with, for example, a sensor, a software application, or any other technique that is configured to monitor an availability of cellular coverage for the device 10. If coverage is not available (e.g., cellular connection is lost), the application may monitor a length of time that the cellular coverage is unavailable and compare this length of time to the pre-determined amount of time. Once the length of time of the connection loss matches the pre-determined amount of time, the communications switch 285 may be automatically triggered and the wireless communications circuitry of the case 200 may be activated. For example, after five minutes without cellular connection, the short-range transceiver 283 may be enabled for communication over the short-range communication network (e.g., FRS and/or GMRS).

According to one embodiment, the wireless communications circuitry included within the communications module 274 may include a beacon transmitter 288. The beacon transmitter 288 may be configured to transmit a rescue signal via, for example, the antenna 284. The rescue signal may be detected by rescue workers who are searching for individuals caught in, for example, an avalanche or other emergency situation. The beacon transmitter 288 may be configured to transmit in digital and/or analog mode. For example, if transmitting digital information, the beacon transmitter 288 may operate within a 406 MHz frequency band, and if transmitting analog information, the beacon transmitter 288 may operate within 121.5 MHz band. According to one embodiment, the beacon transmitter 288 may incorporate Global Positioning System (GPS) information into the transmitted signal.

According to one embodiment, the wireless communications circuitry of the communications module 274 may include a position data receiver 291 to obtain position-related data from a position data network. For example, the position data receiver 291 may be an autonomous GPS receiver that operates within a 1575 MHz frequency band to obtain GPS coordinates from the GPS system. The position data receiver 291 may be integrated into the case 200 and may function independently of the device 10, particularly any position data receiver included in the device 10.

Figure 10A:
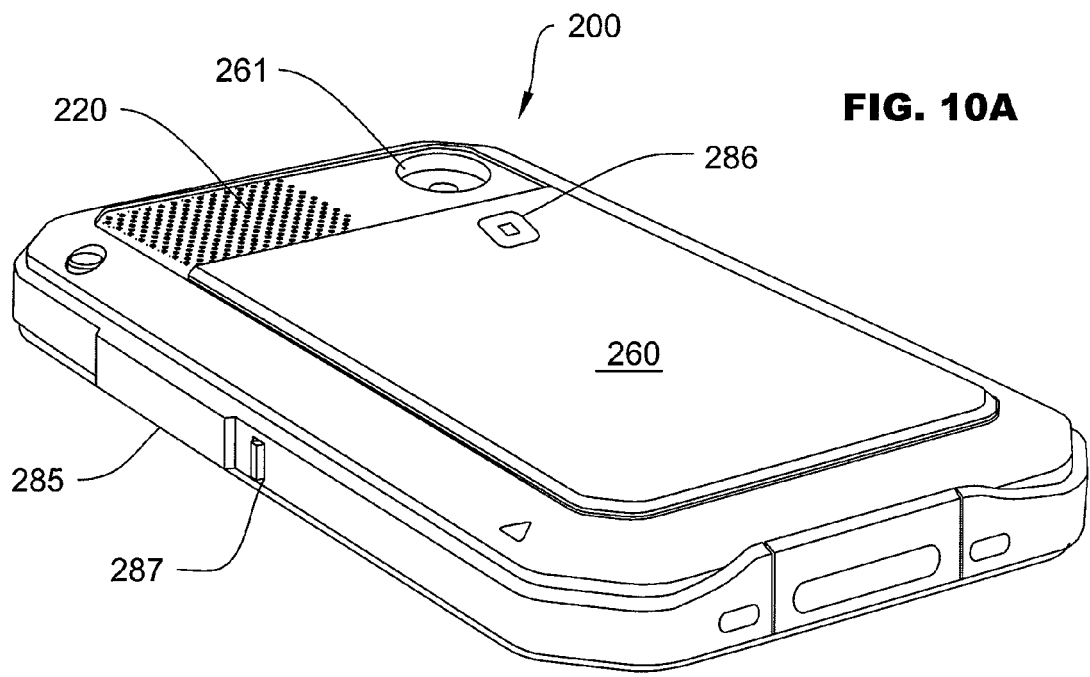
FIGS. 10A and 10B illustrate perspective views of the rear of the portable electronic device case shown in FIG. 9.
Figure 10B:
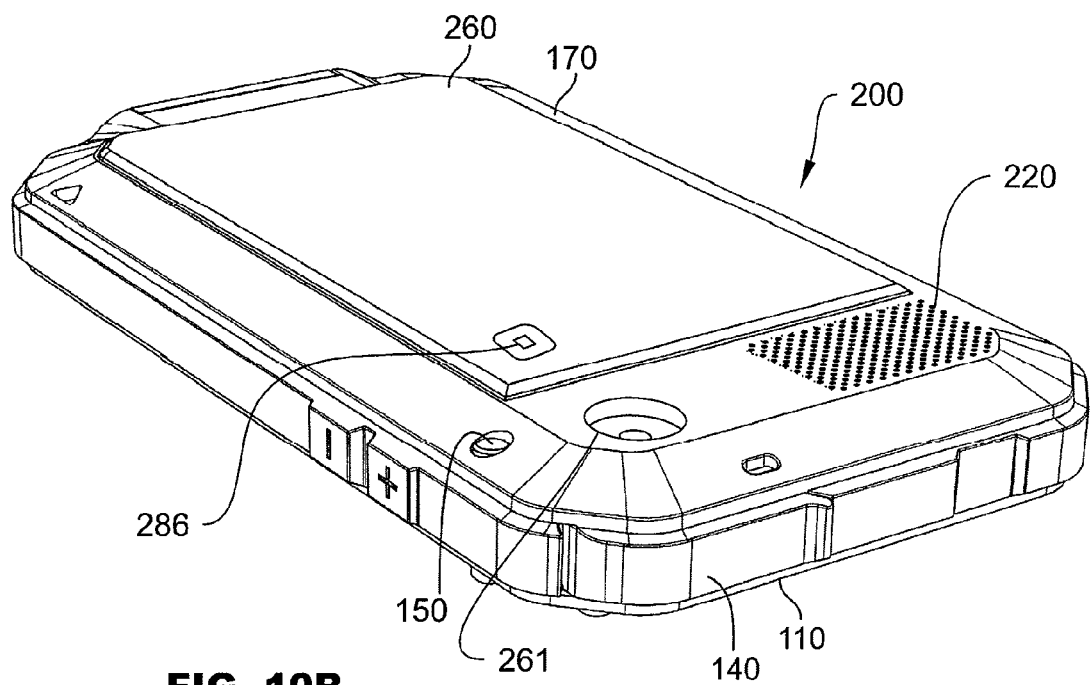
Figure 11A:
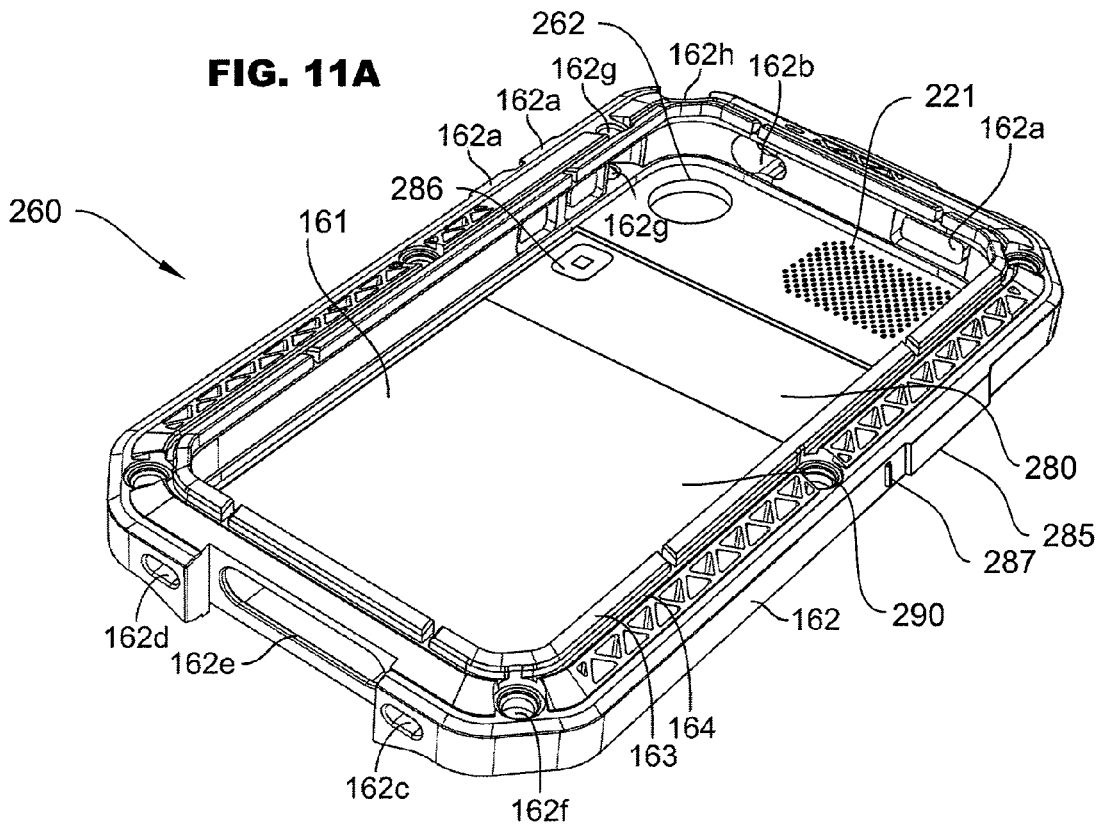
FIGS. 11A and 11B illustrate different views of a boot portion of the portable electronic device case shown in FIG. 9.
Figure 11B:
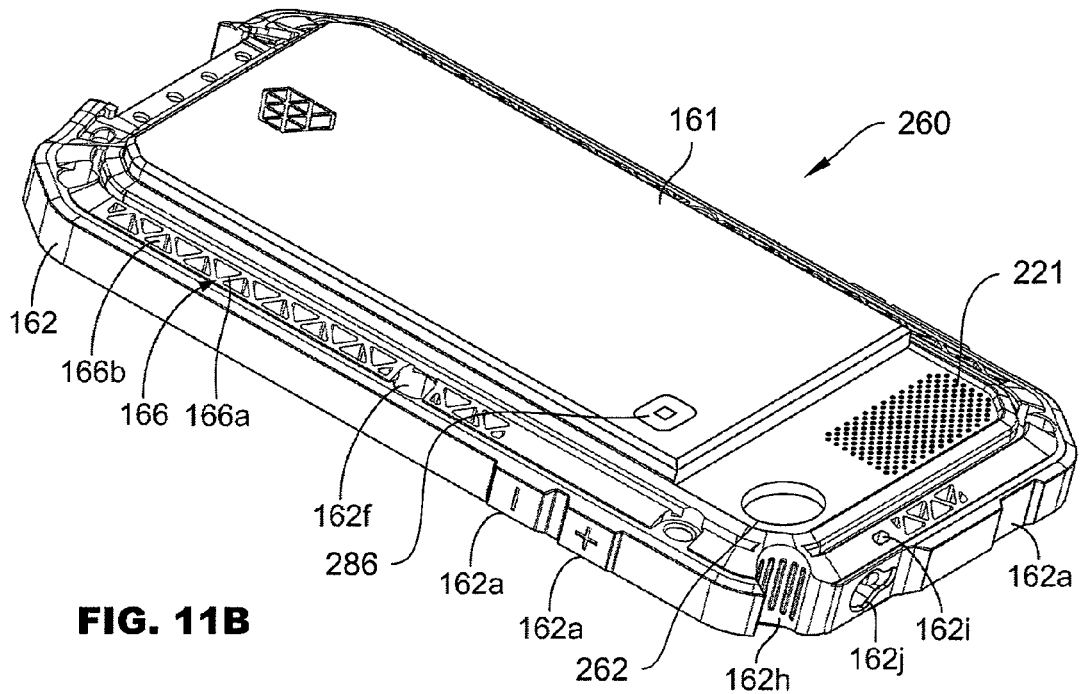

As shown in FIG. 14, the case 200 further includes the light module 276 for controlling a light function of the case 200. The light module 276 may include a light source 286 located on, for example, the back of the case 200 and a light source switch 287 located on, for example, a side of the case 200, as shown in FIG. 10A. As will be appreciated, the light source 286 and/or the light source switch 287 may be positioned in other areas of the case 200 in accordance with the principles disclosed herein, and the present application is not limited to the depicted positions. The light source 286 may be any type of light. In one embodiment, the light source 286 is a high-power LED that emits a very bright light. In some embodiments, the light source 286 may be operatively coupled to the power module 278 in order to provide power to the light source 286. In other embodiments, the light source 286 may include its own battery.

The light source switch 287 may be configured to activate the light source 286. For example, the light source 286 may turn on upon a first actuation of the light source switch 287 and may turn off upon a second actuation of the light source switch 287. The light source switch 287 may be implemented in software or hardware, such as a switch, button, knob, lever, key, or other device capable of controlling the light function of the case 200. In FIG. 10A, for example, the light source switch 287 is depicted as a flip switch that can be moved between two positions (e.g., on and off).

The case 200 further includes the power module 278 for controlling a power function of the case 200. The power module 278 may include a power source, such as, e.g., battery 290, that is configured to provide power to the case 200. The battery 290 may be an auxiliary battery that is integrated into the case 200. According to one embodiment, the battery 290 may have a strength or capacity of 1800 milliamps hour (mAh). According to another embodiment, the battery 290 may have a strength or capacity of 2400 mAh, which is thicker than the 1800 mAh battery. To accommodate the higher capacity battery, the case 200, more particularly, the boot portion 260, may be made thicker as well (e.g., 2 millimeters (mm) thicker).

The power module 278 may also include a power port 292 that is configured to operatively connect the battery 290 to the device 10. For example, the power port 292 may operatively connect components of the device 10 to the case 200. In some embodiments, the power port 292 may operatively couple a display, a memory, a speaker, and/or a processor of the device 10 to the case 200. The power port 292 may include any type of connector for connecting to the device 10. According to one embodiment, the power port 292 may include a 30-pin connector configured to be inserted into a communications interface of, for example, an iPhone® 4 or 4s. According to other embodiments, the power port 292 may include, for example, a mini-USB (Universal Serial Bus) connector configured for insertion into a communications interface of several other types of wireless communication devices.

In some embodiments, the power module 278 may be configured to operate as a back-up power source for the device 10. For example, the power source 290 may be electrically connected to a primary power source or internal battery of the device 10 via the power port 292. The battery 290 may be configured to provide power to the device 10 when a remaining change of the primary power source of the device 10 falls below a pre-determined level. According to one aspect, the power module 278 may be configured to automatically provide the back-up battery function upon detecting the pre-determined level of remaining change in the internal battery of the device 10. In another example, the device 10 may be configured to send a signal through the power port 292 to the power module 278 indicating that the remaining charge in the internal battery of the device 10 is at or below a predetermined level (e.g., at 0.5% battery life). Upon receiving this signal, the battery 290 may automatically begin supplying power to the device 10 through the power port 292.

According to some embodiments, the battery 290 may be rechargeable. In one embodiment, the battery 290 may be recharged via a power cord electrically coupled to the power port 292. In another embodiment, the battery 290 may be removed from the case 200 and placed in an independent charging station for recharging. In yet another embodiment, the battery 290 may a pre-charged battery (e.g., non-rechargeable) that can be removed from the case 200 and replaced with another pre-charged battery pack once the charge in the first battery pack is depleted.

In FIG. 13, the battery 290 is shown as being positioned below the printed circuit board 280. As will be appreciated, the present application is not limited to the illustrated positions of the battery 290 and the printed circuit board 280. For example, in one embodiment, the printed circuit board 280 could be positioned below, under, and/or on top of the battery 290. The exact location of the battery 290 and the printed circuit board 280 may depend on a variety of factors, including the layout of components within the device 10 (e.g., to the extent that it affects the locations of the camera, the vibration switch, the communications interface, etc.) and the layout of other components of the case 200 (e.g., the speaker 281, the microphone 282, the light source 286, the light source switch 287, the communication switch 285, etc.).

According to some embodiments, the printed circuit board 280 may include a processor 289 configured to control the operations of one or more of the modules 272, 274, 276, and 278, and/or other aspects of the case 200. For example, the processor 289 may be operatively coupled to the communications module 274 and/or the audio module 272 in order to facilitate the communication function of the case 200. Similarly, the processor 289 may be operatively coupled to the power module 278, and more particularly, the power port 292, to transmit and receive signals from the device 10, such as, e.g., the signal indicating low battery power in the device 10. To that end, the processor 289 may operate in conjunction with the processor of the device 10. According to some embodiments, the processor 289 may execute computer-readable program code that is stored on a computer usable storage medium (e.g., standard random access memory (RAM) or other memory device). The program code may be stored in a memory of the case 200 (not shown) or the memory of the device 10. The program code may be configured to implement one or more methods or software applications that are associated with the case 200, including the methods described below. The program code may be implemented in any desired language and machine code (e.g., C, C++, CSS, XML, and/or other others).

In accordance with the principles disclosed herein, a method for locating preselected contacts using a wireless communication device (such as the device 10) and a protective case (such as the case 200) for housing the wireless communication device will now be described. The method may be implemented in software (such as a mobile application) that is executed by a processor of the wireless communication device and/or a processor of the protective case (such as the processor 289). The protective case may be operatively coupled to the wireless communication device (for example, as described above).

According to one aspect, the method includes detecting actuation of a communication switch (such as the communication switch 285) of the protective case. For example, the communication switch may be a depressible button, such as a push-to-talk button. The method further includes, upon detecting the actuation, retrieving contact information from the memory of the wireless communication device. The contact information may include information related to contacting a remote communication device associated with a contact of the user. According to another embodiment, the contact information may be stored in and retrieved from the memory of the protective case. The contact information may be related to a plurality of contacts and therefore, a plurality of remote communication devices associated with the contacts.

The method also includes determining, via a position data receiver, a location of the remote communication device of the contact. The position data receiver may be included in the protective case (such as the position data receiver 291) or may be included in the wireless communication device. If the position data receiver is able to locate the remote communication device, the position data receiver may send position coordinates for the located remote communication device.

The method further includes retrieving map information from the memory of the wireless communication device. In some embodiments, the map information may be stored in and retrieved from the memory of the protective case 200. Typically (e.g., when cellular network coverage is available), in order to view and utilize a desired map a user will access a map application (e.g., a native map application or an aftermarket mobile application, such as Google Maps, Waze, etc.) stored on the wireless communication device. The map application typically utilizes a cellular network and/or a WiFi connection to download map information and display the downloaded information as a map on a display of the wireless communication device. Thus, in situations where cellular network coverage is unavailable, the map application will have limited functionality. To address this issue, the present method utilizes pre-stored map information (e.g., "cached" information) that was downloaded at a previous time when cellular network coverage was still available. According to some aspects, the method may include periodically downloading map information and storing the map information in the memory of the wireless communication device (or the memory of the protective case). For example, map information may be downloaded once a day, once a week, once a month, etc. In some embodiments, the map information may be downloaded each time the map is updated.

The method also includes displaying the map information on the display of the wireless communication device and displaying the location of the remote communication device in relation to said map information. For example, the cached map information may be displayed as a map on the display of the wireless communication device. The location of each located remote communication device may be represented by an indicator (e.g., a red dot, a star, a pulsing light, etc.) on the map. The displayed location of the remote communication device may be periodically updated to reflect real-time movement of the remote communication device. For example, the indicator may move on the map in accordance with the real-time movement of the remote communication device.

An exemplary application of the method for locating preselected contacts will now be described. In one embodiment, a user of the protective case (e.g., case 200) may press the push-to-talk button (e.g., communication switch 285) of the protective case. The case may be configured to initiate a map function upon actuation of the button. The map function may include displaying the real-time locations of preselected contacts on a map. The map function may be carried out by a wireless communication device (e.g., device 10) that is housed within the protective case and is operatively coupled thereto. For example, in response to detecting actuation of the push-to-talk button, the processor (e.g., processor 289) of the protective case may instruct the processor of the wireless communication device to initiate the map function. Accordingly, the processor of the wireless communication device may retrieve contact information from a memory of the wireless communication device. The contact information may include information that enables the case to communicate with and/or locate a remote communication device associated with a contact of the user. The processor of the wireless communication device may send the contact information to a position data receiver (e.g., position data receiver 291) of the wireless communication device and request the position data receiver to determine the location of the remote communication device of the contact. For example, the position data receiver may be a GPS receiver that is capable of utilizing the GPS network to identify the coordinates of the remote communication device. The processor of the wireless communication device may also retrieve map information from the memory of the wireless communication device and display the retrieved map information on a display of the wireless communication device. Once the position data receiver determines the location of remote communication device, this location may be displayed on the map on the display of the wireless communication device. For example, the location may be represented by a blinking light, a red dot, etc. The displayed location may be a real-time location of the remote communication device and therefore, may be continuously updated to show any movement of the remote communication device. In the above manner, pressing the push-to-talk button included in the protective case may launch a mobile application within the wireless communication device, the mobile application being configured to display, on the display of the device, a map showing the real-time locations of preselected contacts.

In accordance with the principles disclosed herein, a method for communicating with one or more preselected contacts utilizing a protective case (such as the case 200) for housing a wireless communication device (such as the device 10) will now be described. The method may be implemented in software (such as a mobile application) that is executed by a processor of the wireless communication device and/or a processor of the protective case (such as the processor 289). The protective case may be operatively coupled to the wireless communication device (for example, as described above).

According to one aspect, the method includes detecting actuation of a communication switch (such as the communication switch 285) of the protective case. For example, the user may press the push-to-talk button on the case. Upon detecting the actuation, the method includes retrieving contact information associated with the one or more contacts from a memory. The memory may be included in the protective case or the wireless communication device. Each contact may be associated with a remote communication device and contact information for communicating with the remote communication device.

According to some aspects, the one or more preselected contacts may be identified by using the wireless communication device. For example, the device may include a mobile application for creating a group of contacts that a user of the device would like to communicate with in emergency situations and/or when cellular network coverage is unavailable. The group may be created by selecting from a plurality of contacts stored in the memory of the wireless communication device. For example, in the United States, use of the GMRS network requires a GMRS license issued by the Federal Communications Commission (FCC). This GMRS license permits GMRS use between immediate family members of the license holders, but does not allow use among, for example, employees of the license holder. Thus, the mobile application may be configured to enable the user of the wireless communication device to create a "family" group that includes the contact information of the immediate family members of the user. As will be appreciated, other types of groups may be created using the mobile application depending on the short range network being used. For example, the FRS network does not have the same stringent requirements of the GMRS network, and therefore, allows communication among non-family members over the FRS network.

The method for communicating with one or more preselected contacts further includes determining whether the remote communication device of each contact is within a range of the protective case. According to one aspect and as described above, the range or communication perimeter of the protective case may vary depending on the type of short range communication technology being utilized and the nature and number of obstructions affecting a line of sight between the wireless communication device and the remote communication devices. The method further includes upon determining that at least one remote communication device is within the range of the protective case, transmitting voice signals from the protective case to said remote communication device.

An exemplary application of the method for communicating with one or more preselected contacts will now be described. In one embodiment, a user of the protective case described herein (e.g., case 200) may press a push-to-talk button (e.g., communication switch 285) included on the case. The case may be configured to contact one or more preselected contacts upon actuation of the button. Accordingly, the processor (e.g., processor 289) of the protective case may send a request to the processor of the wireless communication device (e.g., device 10) housed within the protective case, the request seeking to retrieve contact information associated with the one or more preselected contacts from the memory of the wireless communication device. In some embodiments, for example where the case is operating completely independently of the wireless communication device, the contact information may be retrieved from a memory of the protective case instead. Once the contact information is retrieved, the processor of the case may provide the contact information to the wireless communication circuitry included within the case. Further, the processor may instruct the wireless communication circuitry to contact, or attempt to contact, the one or more preselected contacts using the provided contact information. If the contacts are within a prespecified range of the protective case (e.g., less than 1.5 km for FRS radios and less than 35 km for GMRS radios), the processor will instruct the wireless communication circuitry of the protective case to being transmitting. In the above manner, pressing the push-to-talk button included in the protective case may cause the user's voice signals to be transmitted to preselected contacts that are within range of the protective case.

The above embodiments describe the protective case 200 as including the audio module 272, the power module 278, the communications module 274, and the light module 276. In some alternative embodiments, the protective case 200 may be configured as a removable, back shell that includes only a subset of the modules 272, 274, 276, and 278. For example, in one embodiment, the protective case 200 may include only the power module 278, or more specifically, the battery 290 for providing power to the device 10. In another embodiment, the protective case 200 may include only the communication module 274 for providing additional communication capabilities (e.g., short-range, GPS, beacon) in addition to the wireless communication capabilities (e.g., cellular communication, WiFi, etc.) of the device 10. In accordance with such embodiments, a plurality of removable protective cases having different electronic components and functionalities may be created.

It will be understood by those skilled in the art that various changes may be made and equivalents may be substituted without departing from the scope of the novel and non-obvious techniques disclosed in this application. In addition, many modifications may be made to adapt a particular situation or material to the teachings of the novel techniques without departing from its scope. Therefore, it is intended that the novel techniques not be limited to the particular techniques disclosed, but that they will include all techniques falling within the scope of the appended claims.

What is claimed is:

1. A protective case for housing a wireless communication device, the wireless communication device having at least a memory, a processor, and a display, wherein the protective case comprises:
    integral wireless communication circuitry independent of the wireless communication device, the wireless communication circuitry configured to enable communication between the protective case and one or more remote communication devices via a short range network;
    an integral speaker configured to reproduce audio signals received by the integral wireless communication circuitry; and
    an integral power source configured to provide power to at least the integral wireless communication circuitry and the integral speaker,
    wherein the integral wireless communication circuitry and the integral speaker are capable of functioning independently of the wireless communication device.

2. The protective case of claim 1, wherein the integral power source is electrically connected to a primary power source of the wireless communication device.

3. The protective case of claim 2, wherein the integral power source is configured to provide power to the wireless communication device when a remaining charge in the primary power source of the wireless communication device falls below a pre-determined level.

4. The protective case of claim 1, further including an integral antenna that is tuned to transmit and/or receive signals within one or more predetermined frequency bands associated with the short range network.

5. The protective case of claim 1, further including a communication switch for controlling the communication with the one or more remote communication devices.

6. The protective case of claim 5, wherein actuation of the communication switch places the integral wireless communication circuitry in a transmission mode.

7. The protective case of claim 5, wherein the communication switch is automatically engaged when the wireless communication device remains without connection to a cellular communication network for a pre-determined amount of time.

8. The protective case of claim 1, further including an integral microphone configured to capture audio signals, the microphone being operatively coupled to the wireless communication circuitry, wherein the audio signals are transmitted via the wireless communication circuitry to the one or more remote communication devices.

9. The protective case of claim 1, further including an integral light source operatively coupled to the integral power source.

10. The protective case of claim 1, wherein the protective case is capable of being operatively coupled to the processor, the memory, and the display of the wireless communication device.

11. A method for locating preselected contacts using a wireless communication device and a protective case for housing the wireless communication device, the protective case being operatively coupled to the wireless communication device, the method comprising:
    detecting actuation of a communication switch of the protective case;
    upon detecting the actuation, retrieving contact information from a memory of the wireless communication device, the contact information including information related to contacting a remote communication device associated with a contact of a user;
    determining, via a position data receiver, a location of the remote communication device of the contact;
    retrieving map information from the memory of the wireless communication device;
    displaying the map information on a display of the wireless communication device; and
    displaying the location of the remote communication device of the contact relative to the displayed map information.

12. A method for communicating with one or more preselected contacts utilizing a protective case for housing a wireless communication device, the method comprising:
    detecting actuation of a communication switch of the protective case;
    upon detecting the actuation, retrieving contact information associated with one or more preselected contacts from a memory, each contact being associated with a remote communication device, wherein the contact information includes information related to communicating with the remote communication devices of the one or more preselected contacts;
    determining whether the remote communication device of each contact is within a range of the protective case; and
    upon determining that at least one remote communication device is within the range of the protective case, transmitting voice signals from the protective case to the at least one remote communication device.

* * * * *